United States Patent
Matsubara

(10) Patent No.: US 7,562,329 B2
(45) Date of Patent: Jul. 14, 2009

(54) MASTER-SLICE-TYPE SEMICONDUCTOR INTEGRATED CIRCUIT HAVING A BULK LAYER AND A PLURALITY OF WIRING LAYERS AND A DESIGN METHOD THEREFOR

(75) Inventor: Hiroyuki Matsubara, Kawasaki (JP)

(73) Assignee: Fujitsu Microelectronics Limited, Tokyo (JP)

(*) Notice: Subject to any disclaimer, the term of this patent is extended or adjusted under 35 U.S.C. 154(b) by 205 days.

(21) Appl. No.: 11/108,676

(22) Filed: Apr. 19, 2005

(65) Prior Publication Data

US 2005/0235239 A1    Oct. 20, 2005

(30) Foreign Application Priority Data

| Apr. 19, 2004 | (JP) | ............................. 2004-123320 |
| Nov. 5, 2004 | (JP) | ............................. 2004-322730 |
| Mar. 4, 2005 | (JP) | ............................. 2005-061442 |

(51) Int. Cl.
G06F 17/50    (2006.01)

(52) U.S. Cl. ............................. 716/13; 716/12; 716/14

(58) Field of Classification Search ................. 716/8–14
See application file for complete search history.

(56) References Cited

U.S. PATENT DOCUMENTS

| 4,701,778 | A | * | 10/1987 | Aneha et al. ................. 257/207 |
| 4,816,887 | A | * | 3/1989 | Sato ............................ 257/206 |
| 4,949,275 | A | | 8/1990 | Nonaka |
| 5,206,529 | A | | 4/1993 | Mine |
| 5,224,057 | A | | 6/1993 | Igarashi et al. |
| 5,355,322 | A | | 10/1994 | Yamashita et al. |
| 5,397,749 | A | | 3/1995 | Igarashi |
| 5,459,340 | A | * | 10/1995 | Anderson et al. ............ 257/203 |
| 5,506,162 | A | | 4/1996 | Hirose et al. |
| 5,551,014 | A | * | 8/1996 | Yoshida et al. ................. 716/11 |
| 5,691,218 | A | | 11/1997 | Colwell et al. |

(Continued)

FOREIGN PATENT DOCUMENTS

EP    0 855 742    7/1998

(Continued)

OTHER PUBLICATIONS

Patent Abstracts of Japan: Japanese Patent Application Publication No. 6-163860 dated Jun. 10, 1994. English Abstract Only.

(Continued)

*Primary Examiner*—Vuthe Siek
(74) *Attorney, Agent, or Firm*—Staas & Halsey LLP

(57) ABSTRACT

In a master-slice-type semiconductor integrated circuit having a bulk layer on which a plurality of bulk patterns to realize specific circuit functions are formed, and a plurality of wiring layers including variable wiring patterns of which wiring pattern is changeable by a user and fixed wiring layers of which wiring patterns are unchangeable by the user, a plurality of bulk patterns are previously fixed and placed on an entire chip surface where bulk patterns are capable of being formed in the bulk layer, and thereby, a semiconductor integrated circuit corresponding to a use purpose can be manufactured by only designing the wirings of the variable wiring layers and producing masks for forming the designed wirings in the wiring layers at the user side.

35 Claims, 22 Drawing Sheets

U.S. PATENT DOCUMENTS

| | | |
|---|---|---|
| 5,872,027 A | 2/1999 | Mizuno |
| 5,898,194 A | 4/1999 | Gheewala |
| 5,913,101 A | 6/1999 | Murofushi et al. |
| 5,987,743 A | 11/1999 | Yui |
| 6,476,425 B1 | 11/2002 | Ono |
| 6,516,457 B1 | 2/2003 | Kondou |
| 6,516,458 B1 | 2/2003 | Fukui |
| 6,861,866 B2 * | 3/2005 | Han .......................... 326/16 |
| 7,053,424 B2 * | 5/2006 | Ono .......................... 257/208 |
| 2002/0041015 A1 * | 4/2002 | Kodaira et al. .............. 257/678 |
| 2002/0145444 A1 | 10/2002 | Mizuno et al. |
| 2004/0017219 A1 | 1/2004 | Han |
| 2004/0089881 A1 | 5/2004 | Ono |

FOREIGN PATENT DOCUMENTS

| | | |
|---|---|---|
| KR | 2000-0035176 | 6/2000 |

OTHER PUBLICATIONS

Partial European Search Report, mailed Mar. 27, 2007 and issued in corresponding European Patent Application No. 05253415.3-2203.

Chinese Office Action mailed Sep. 14, 2007 in corresponding Chinese Patent Application No. 200510079922.7.

European Search Report mailed Sep. 29, 2007 in corresponding EPC Application No. 05253415.3.

Taiwanese Office Action dated Nov. 16, 2007 in corresponding Application No. 94118559.

* cited by examiner

FIG. 3A
|  | B1A | B1B | B1C |
|---|---|---|---|
| Bulk1 (PLL) | ▒ | ▓ | ░ |
FIG. 3B
|  | B2A | B2B | B2C | B2D |
|---|---|---|---|---|
| Bulk2 (I/O) | ▨ | ▨ | ▤ | ▬ |
FIG. 3C
|  | B3A | B3B | B3C | B3D | B3E |
|---|---|---|---|---|---|
| Bulk3 (RAM1) | ▦ | ▦ | ▨ | ▨ | ▦ |
FIG. 3D
|  | B4A | B4B | B4C | B4D |
|---|---|---|---|---|
| Bulk4 (RAM2) | ▦ | ▨ | ░ | ▨ |
FIG. 3E
|  | B5A | B5B | B5C | B5D | B5E |
|---|---|---|---|---|---|
| Bulk5 (UnitCell) | ▦ | ▨ | ▤ | ▦ | ▒ |
FIG. 4A
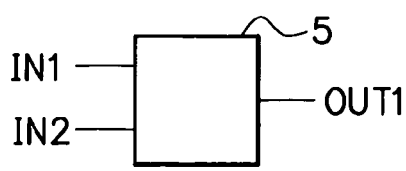
FIG. 4B
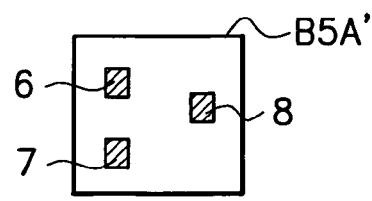

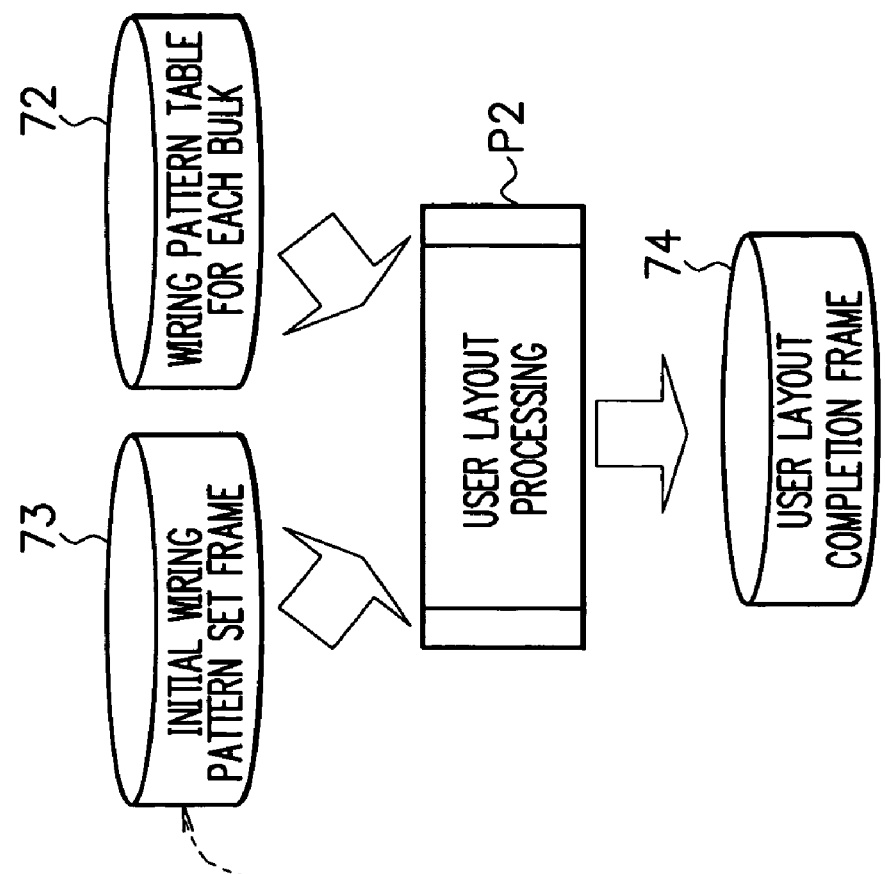
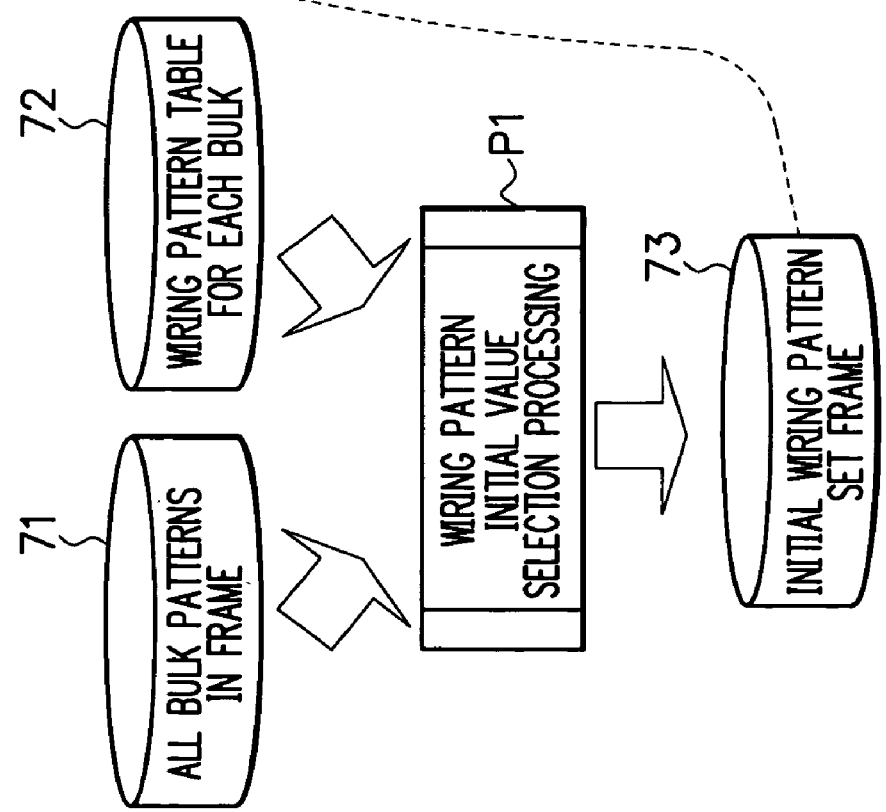

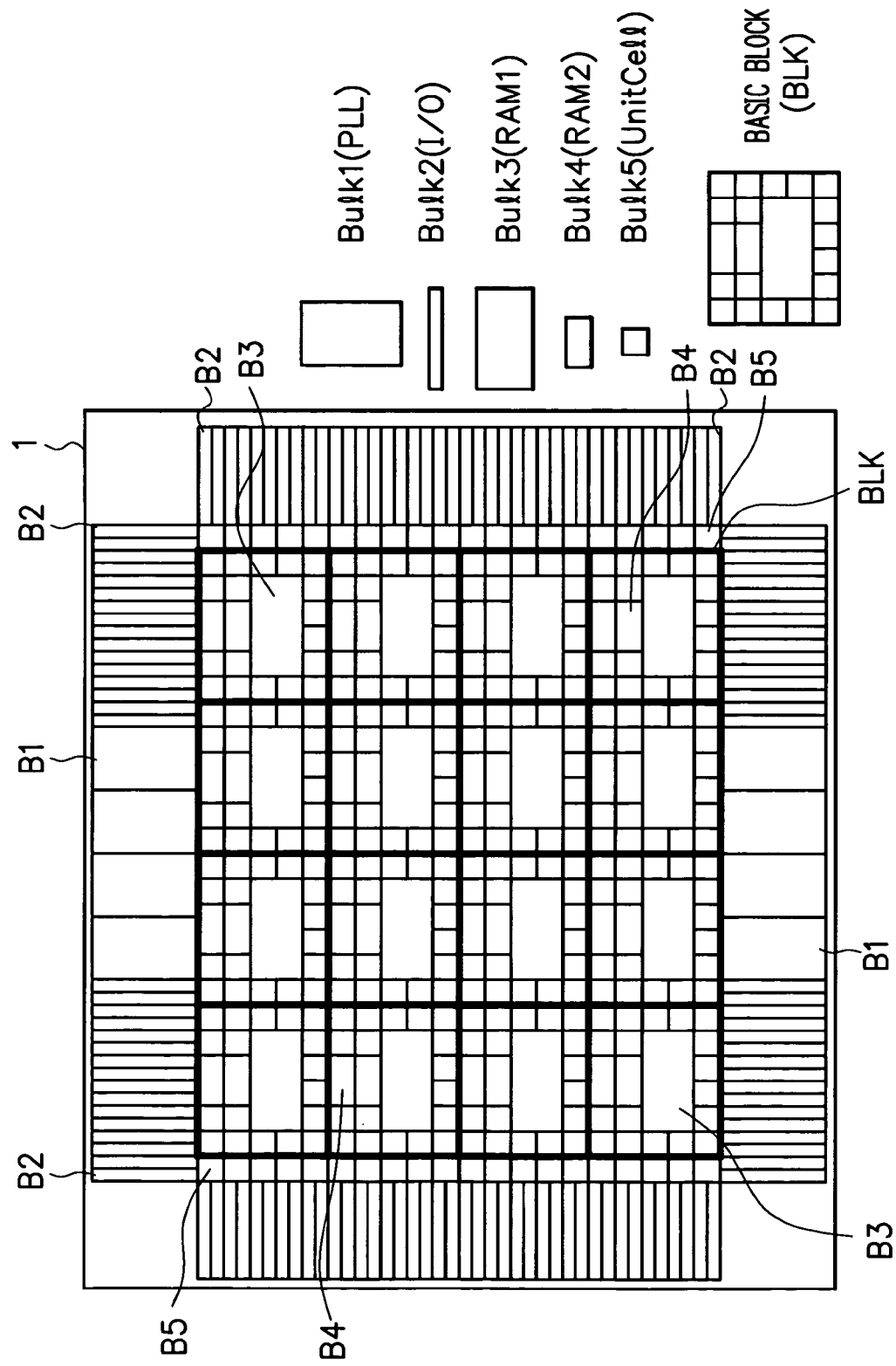

F I G. 15
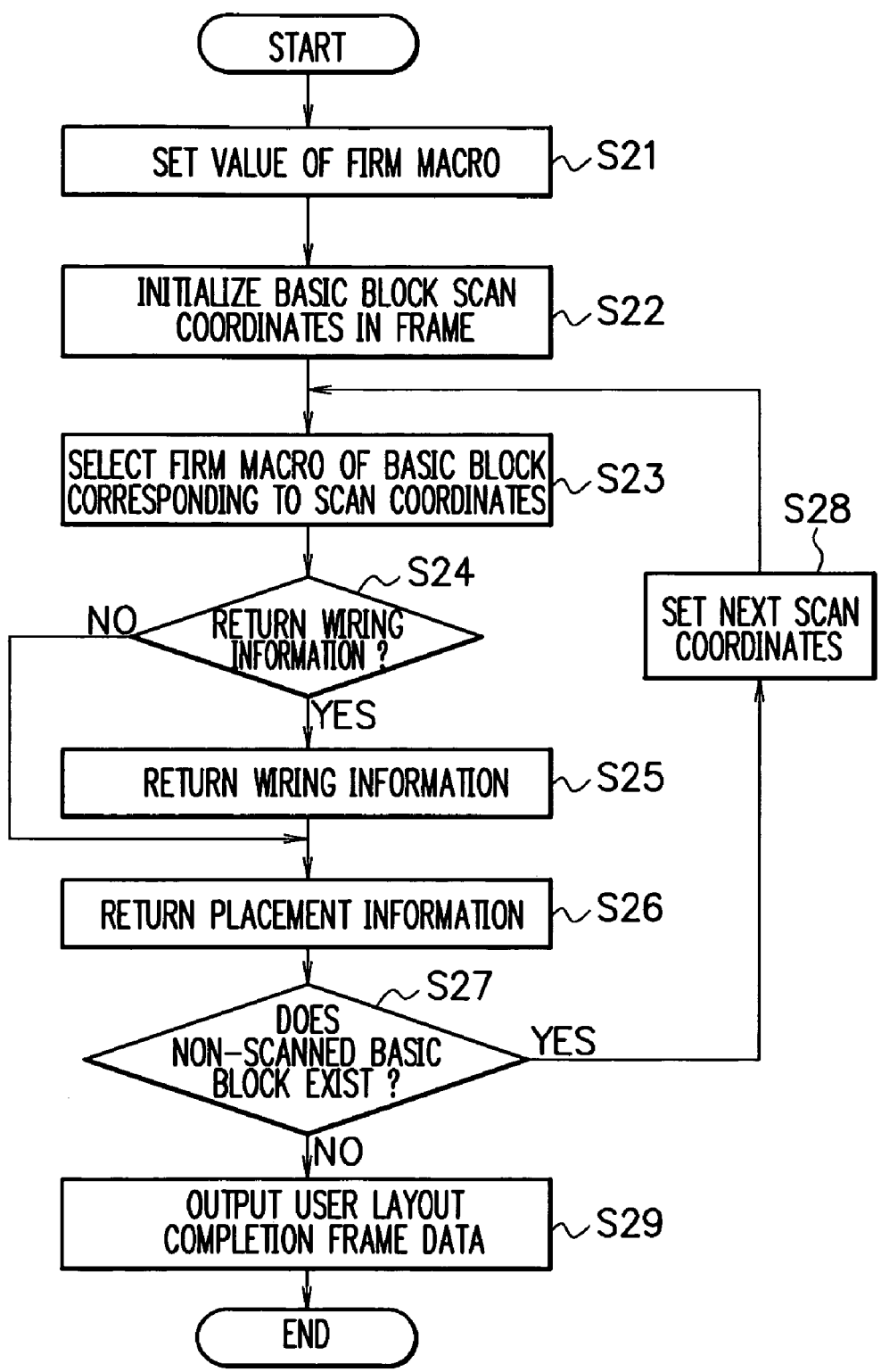

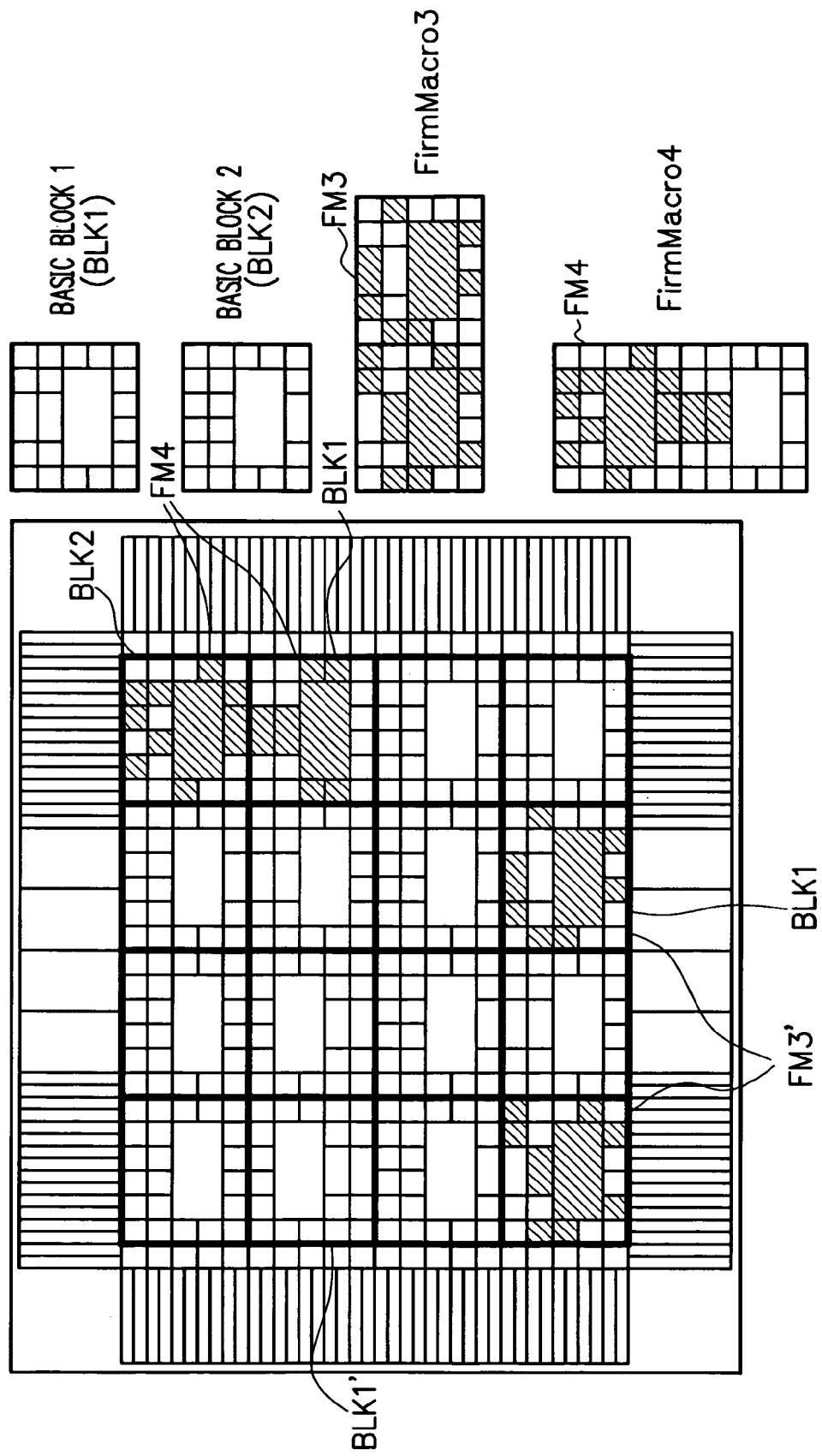

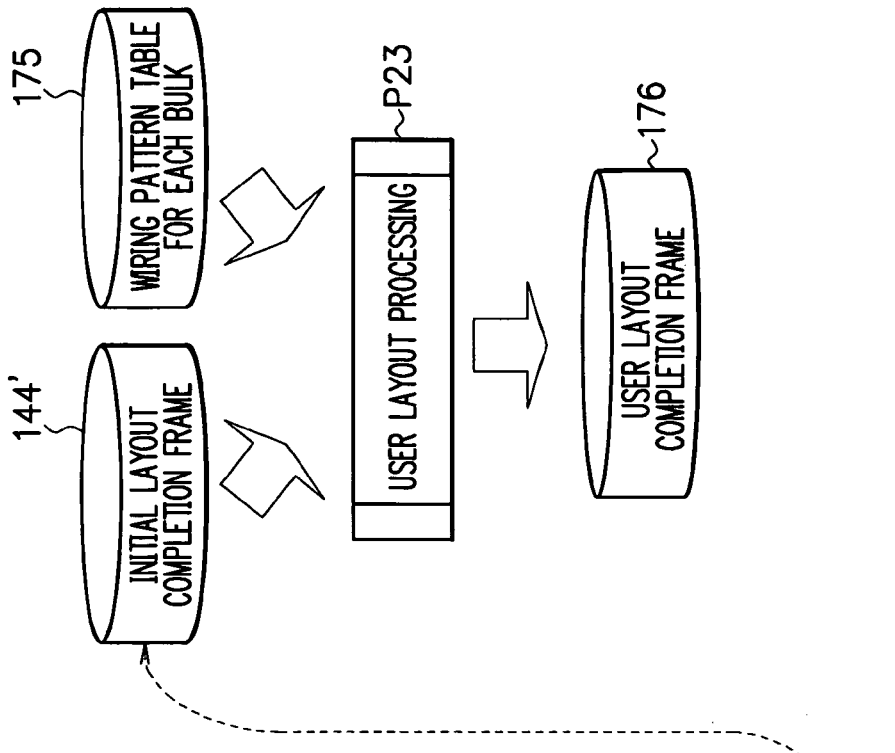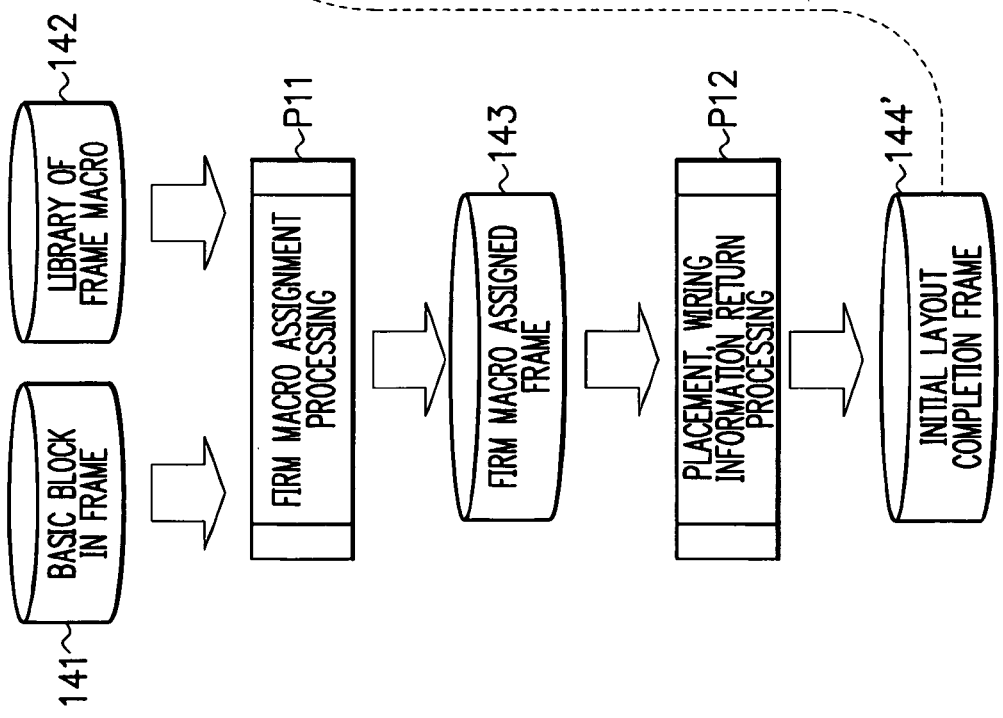

F I G. 18
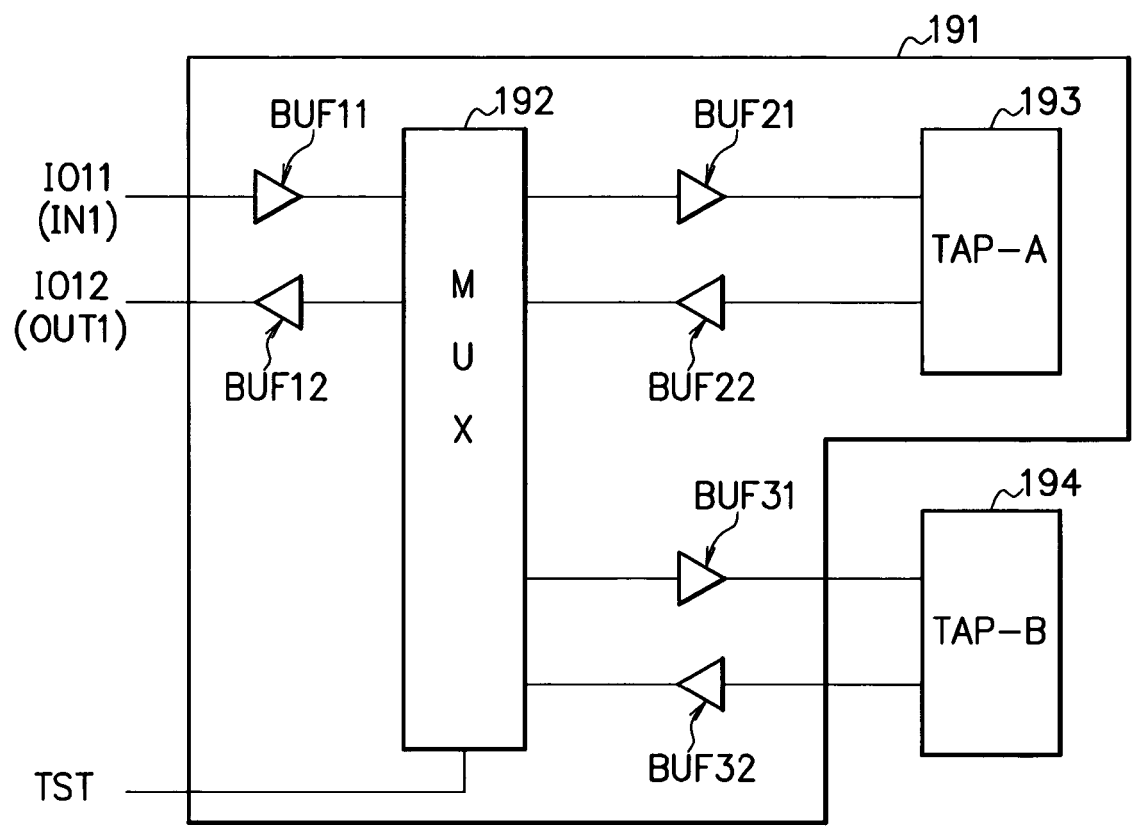

F I G. 21
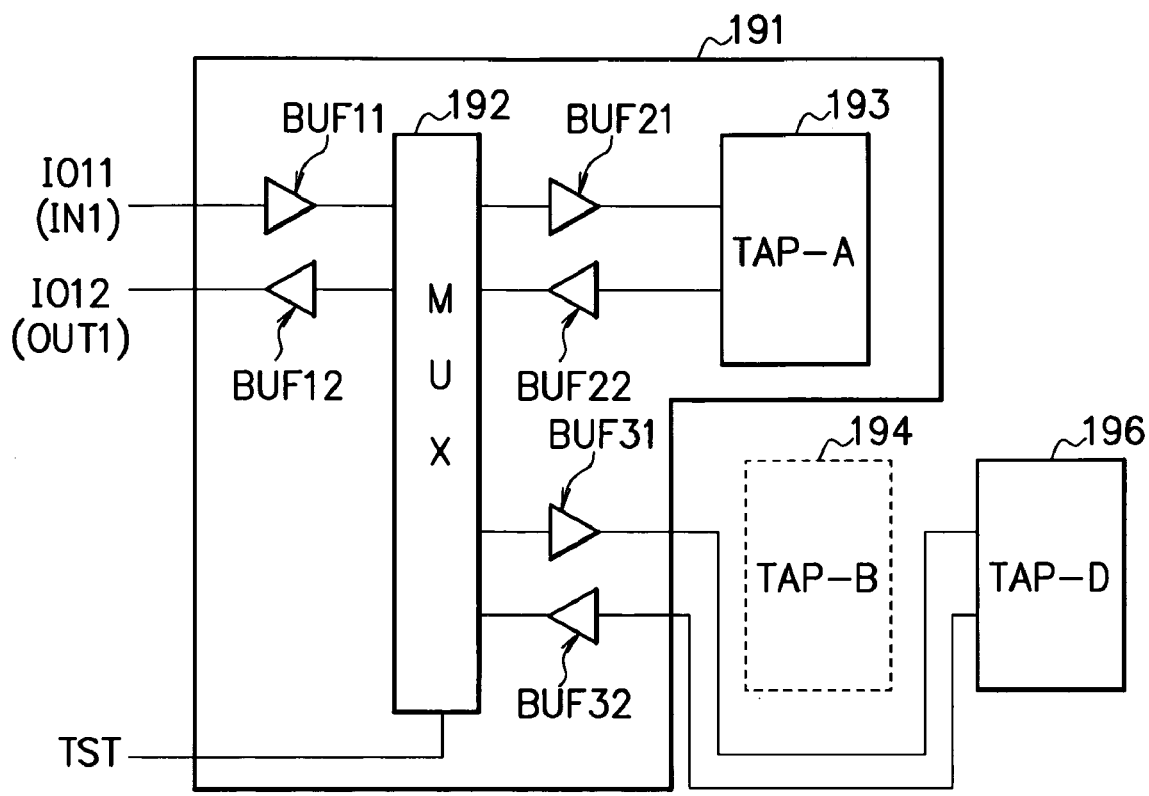

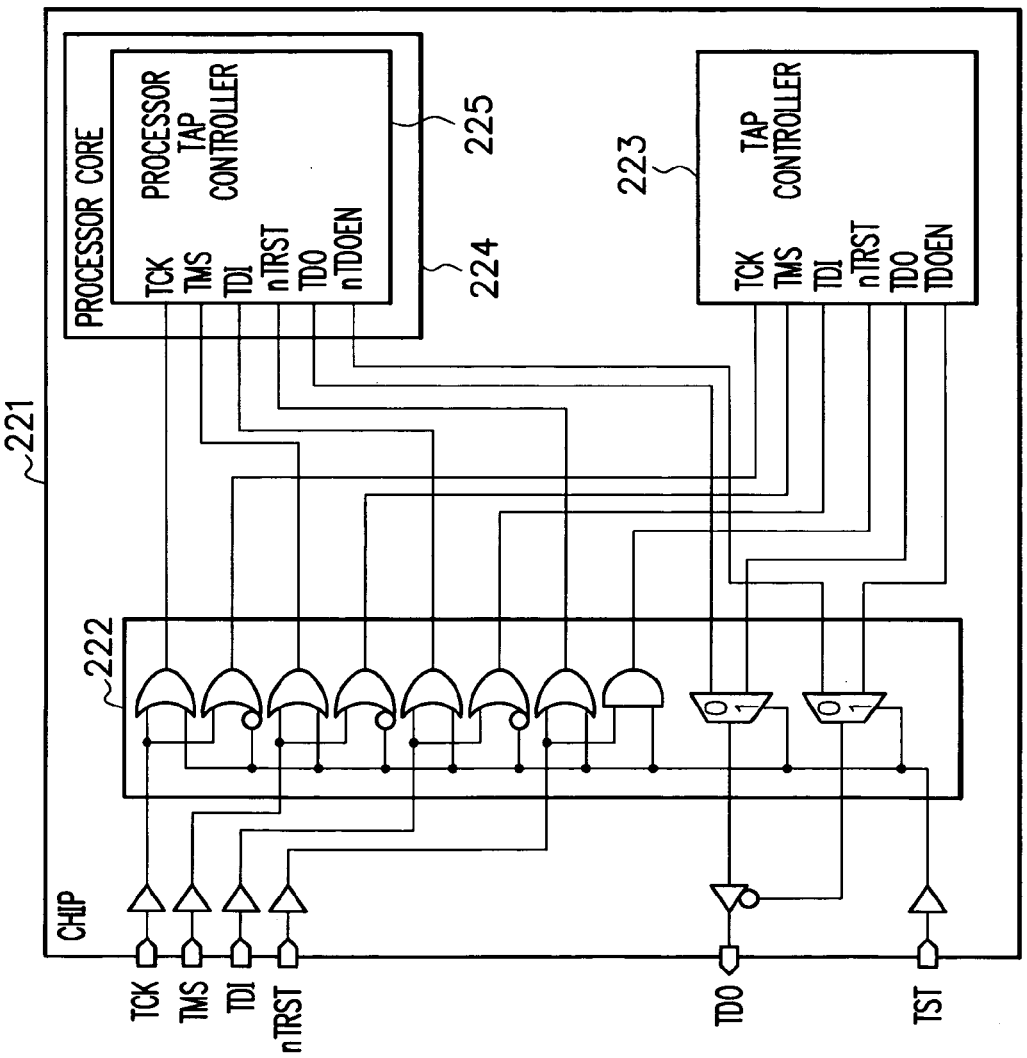
F I G. 22

F I G. 24
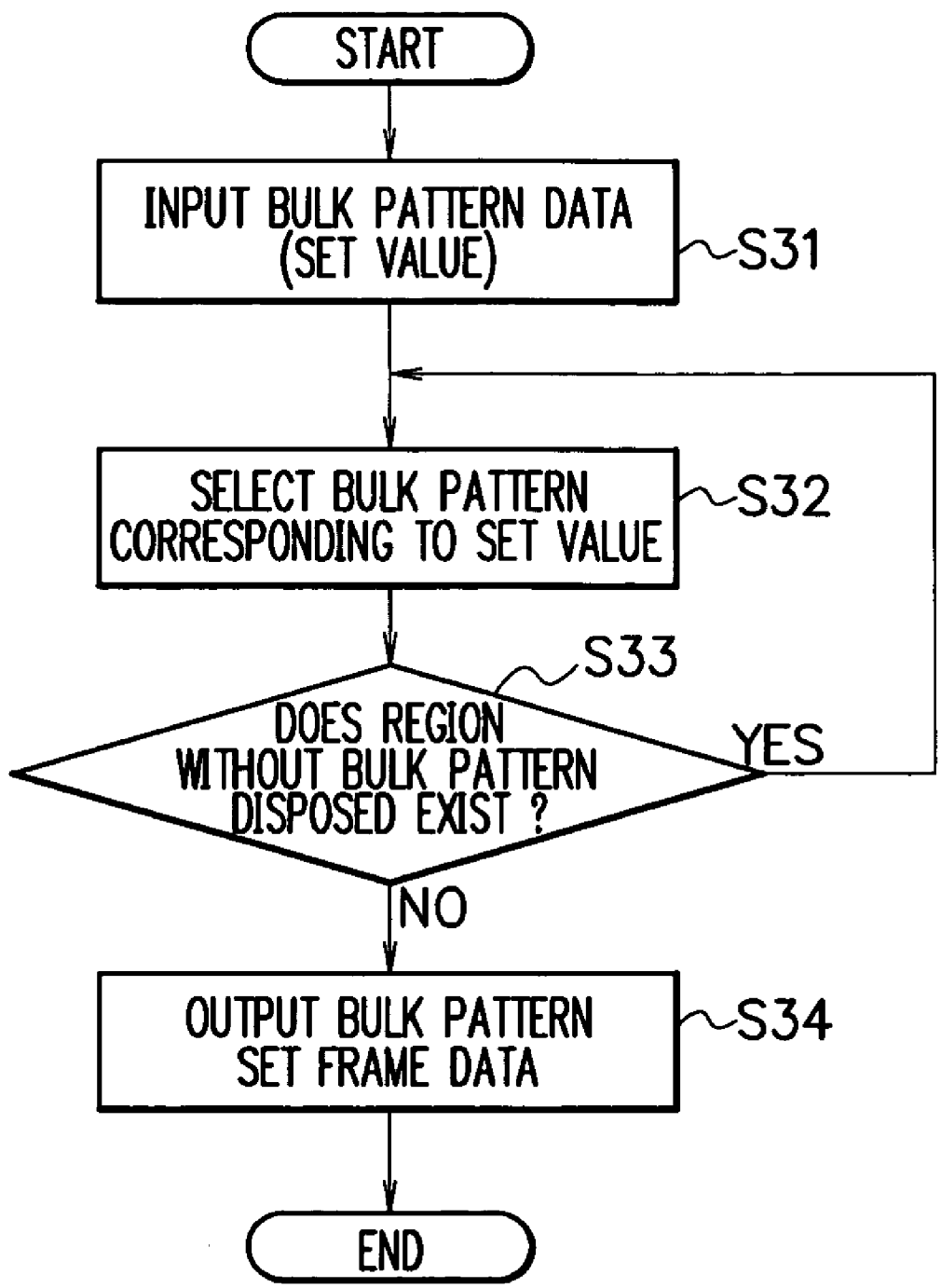

MASTER-SLICE-TYPE SEMICONDUCTOR INTEGRATED CIRCUIT HAVING A BULK LAYER AND A PLURALITY OF WIRING LAYERS AND A DESIGN METHOD THEREFOR

CROSS-REFERENCE TO RELATED APPLICATIONS

This application is based upon and claims the benefit of priority from the prior Japanese Patent Application Nos. 2004-123320, filed on Apr. 19, 2004, 2004-322730, filed on Nov. 5, 2004 and 2005-061442, filed on Mar. 4, 2005, the entire contents of which are incorporated herein by reference.

BACKGROUND OF THE INVENTION

1. Field of the Invention

The present invention relates to a semiconductor integrated circuit and a design method therefor, and particularly to a master-stice-type semiconductor integrated circuit and a layout design method therefor.

2. Description of the Related Art

Conventionally, an ASIC (Application Specific Integrated Circuit), which is a semiconductor integrated circuit for a special use purpose, is realized by utilizing a semiconductor integrated circuit such as a cell base LSI and a FPGA (Field Programmable Gate Array) in many cases. The development of the ASIC in the cell base LSI, for example, is performed by carrying out basic wiring on the basis of cells (basic cells) by combination of the transistors which become the basis and combining the basic cells to be a desired circuit corresponding to the use purpose and forming the necessary wirings.

In a gate array in which the aforementioned basic cells are regularly placed in a semiconductor chip, there is the one in which only the uppermost layer wiring is made changeable in accordance with the use purpose in order to facilitate design and manufacture of the ASIC, and the wirings of the other wiring layers are made fixed wirings (for example, see Patent document 1 and Patent document 2)

[Patent document 1] Japanese Patent Application Laid-open No. 6-163860

[Patent document 2] Japanese Patent Application Laid-open No. 2-30163

In the conventional ASIC development, the process of designing combination of basic cells and wirings is performed for each ASIC (for each individual kind of product) to realize the functions demanded by the users. Accordingly, masks (reticles) used for making the designed circuit onto the semiconductor chip are made for each individual kind of product.

Here, in recent years, a circuit scale capable of being integrated on one semiconductor chip increases with microfabrication of the semiconductor integrated circuit, and in the development of the ASIC, prolongation of the development period and complication of the design and manufacture are increasing. Due to microfabrication of semiconductor integrated circuits and increase in the circuit scales accompanying this, the cost per one mask (reticle) becomes high, and the number of required masks increases, thus sharply raising the cost of the mask required to manufacture one kind of ASIC. Therefore, reduction in the development period and the development cost is demanded.

SUMMARY OF THE INVENTION

The present invention has its object to make it possible to reduce the burden on developing a semiconductor integrated circuit corresponding to a use purpose.

A semiconductor integrated circuit of the present invention is a master-slice-type semiconductor integrated circuit, characterized by having a bulk layer on which a plurality of bulk patterns to realize predetermined circuit functions are formed, and a plurality of wiring layers sequentially formed in layers on the bulk layer and including variable wiring layers of which wiring patterns are changeable by a user and fixed wiring layers of which wiring patterns are unchangeable by the user, and characterized in that the plurality of bulk patterns which are fixed and selected are previously placed on an entire chip surface where the bulk patterns are capable of being formed in the bulk layer.

According to the above described constitution, the bulk patterns are previously fixed and placed on the entire chip surface where the bulk patterns are capable of being formed in the bulk layer, and thereby, the semiconductor integrated circuit corresponding to the use purpose can be manufactured by only designing wirings of the variable wiring layers and producing masks for forming the designed wirings in the variable wiring layers.

BRIEF DESCRIPTION OF THE DRAWINGS

FIGS. 3A to 3E are diagrams for explaining wirings (wiring patterns) formed on bulk patterns;

FIGS. 4A and 4B are diagrams for explaining wiring patterns for input/output terminals;

FIGS. 7A and 7B are diagrams schematically showing a layout design method of the semiconductor integrated circuit in the first embodiment;

FIG. 11 is a diagram showing a configuration example of a semiconductor integrated circuit according to a second embodiment of the present invention;

FIG. 15 is a flowchart showing the layout design method of the semiconductor integrated circuit in the second embodiment;

FIG. 16 is a diagram showing another configuration example of the semiconductor integrated circuit according to the second embodiment;

FIGS. 17A and 17B are diagrams schematically showing another layout design method of the semiconductor integrated circuit in the second embodiment;

FIG. 18 is a circuit configuration diagram showing characteristics of a semiconductor integrated circuit according to a third embodiment of the present invention;

FIG. 21 is a diagram showing still another circuit modified example of the semiconductor integrated circuit in the third embodiment;

FIG. 22 is a diagram showing one example of circuit package of the semiconductor integrated circuit in the third embodiment;

FIG. 24 is a flowchart showing a layout design method according to the initial placement of the bulk patterns in the semiconductor integrated circuit in each of the embodiments.

DETAILED DESCRIPTION OF THE PREFERRED EMBODIMENTS

Hereinafter, embodiments of the present invention will be explained based on the drawings.

In the following explanation, a "bulk layer" means a base of polysilicon, a diffusion layer or the like where transistors are formed and no wiring layer is included in the semiconductor integrated circuit according to the embodiments of the present invention. Namely, the bulk layer corresponds to a transistor layer of a conventional cell base LSI having the transistor layer and a wiring layer.

A "bulk" is a function block which includes a predetermined circuit function made onto the bulk layer, a so-called macro.

First Embodiment

Figure 1:
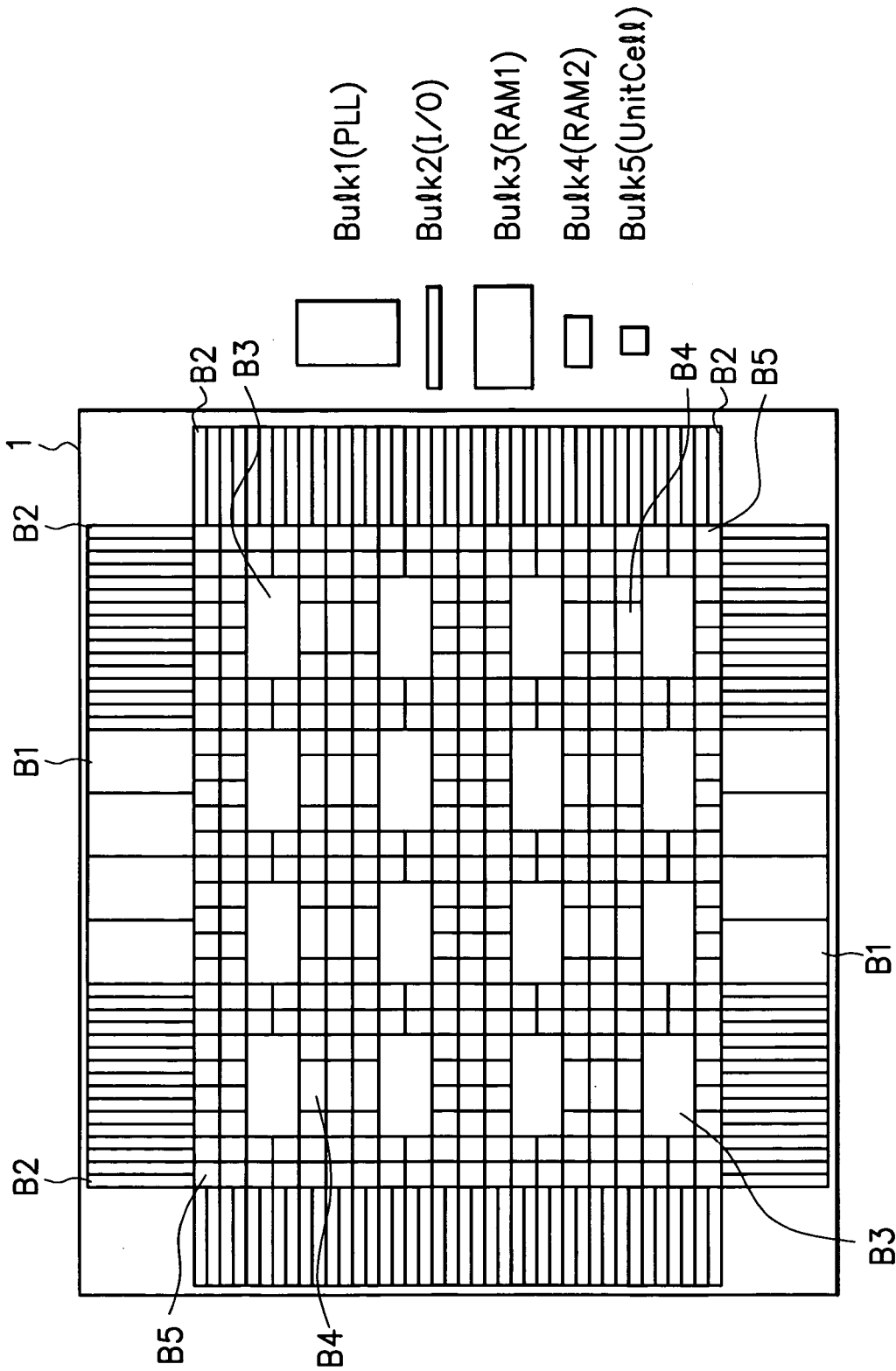
FIG. 1 is a diagram showing a configuration example of a semiconductor integrated circuit according to a first embodiment of the present invention.

FIG. 1 is a diagram showing a configuration example of a semiconductor integrated circuit according to a first embodiment of the present invention, and more specifically, shows a configuration example of the bulk layer in the semiconductor integrated circuit.

The semiconductor integrated circuit according to the first embodiment has a plurality of kinds of bulks (bulk patterns) in a semiconductor chip 1 (hereinafter, the entire semiconductor chip 1 will be also called "a frame") as shown in FIG. 1. The semiconductor integrated circuit in the example shown in FIG. 1 has eight of first bulk patterns B1, 144 of second bulk patterns B2, 16 of third bulk patterns B3, 24 of fourth bulk patterns B4 and 344 of fifth bulk patterns B5.

In the embodiments (including the other embodiments which will be described later), the first bulk pattern B1 is set as a function block of a PLL (Phase Locked Loop) circuit (PLL macro), and the second bulk pattern B2 is set as a function block of an input and output circuit (I/O macro). The third and fourth bulk patterns B3 and B4 are set as function blocks (first and second RAM macros) of the memory (RAM) respectively, the first RAM macro and the second RAM macro differ in at least one of the size and the function (for example, the number of ports, the number of word bits and the like). The fifth bulk pattern B5 is set as a function block (unit cell) with which a user can optionally construct logic, and corresponds to what is called a basic cell in the conventional gate array.

As is obvious from FIG. 1, in the semiconductor integrated circuit according to the first embodiment, not only the fifth bulk pattern B5 (unit cell) corresponding to the basic cell of the conventional gate array, but also the minimum kinds of bulk patterns B1 to B5 are placed so that an inside of the frame 1 are paved with them. Namely, the semiconductor integrated circuit according to the first embodiment is configured by previously embedding the bulk patterns B1 to B5 given various functions by a constant rule, and some circuit functions are formed in all parts (regions) that are paved with the bulk patterns of the bulk layer corresponding to the conventional transistor layer.

The bulk patterns B1 to B5 and their placement in the frame 1 cannot be changed (customized) at a user side. As for the placement of the bulk patterns B1 to B5 in the frame 1, it is desired that they are placed to achieve the circuit configuration estimated to be desired by a great majority of users, or they are placed to achieve the circuit configuration which is estimated to be frequently used by users.

Here, the same bulk patterns, namely the bulk patterns having the same circuit functions have the same sizes and the same graphic patterns (polysilicon, diffusion layer, contact and the like) in the bulks, but the different bulk patterns differ in at least one of the size or the graphic pattern in the bulks. It is desirable that each of the bulk patterns B1 to B5 has the size of an integral multiple of the size of the standard cell (reference cell of the standardized size), but the bulk patterns having the sizes which are not identical to the integral multiples of the size of the standard cell are sometimes included. Each of the bulk patterns B1 to B5 is capable of controlling the circuit function by a wiring (wiring pattern) formed on each of the bulk patterns B1 to B5 as will be described later.

As for the size of the transistors (p-channel transistor and an n-channel transistor) in each of the bulk patterns B1 to B5, the transistors are constructed in the totally defined size so that the users cannot change it freely.

Figure 2:
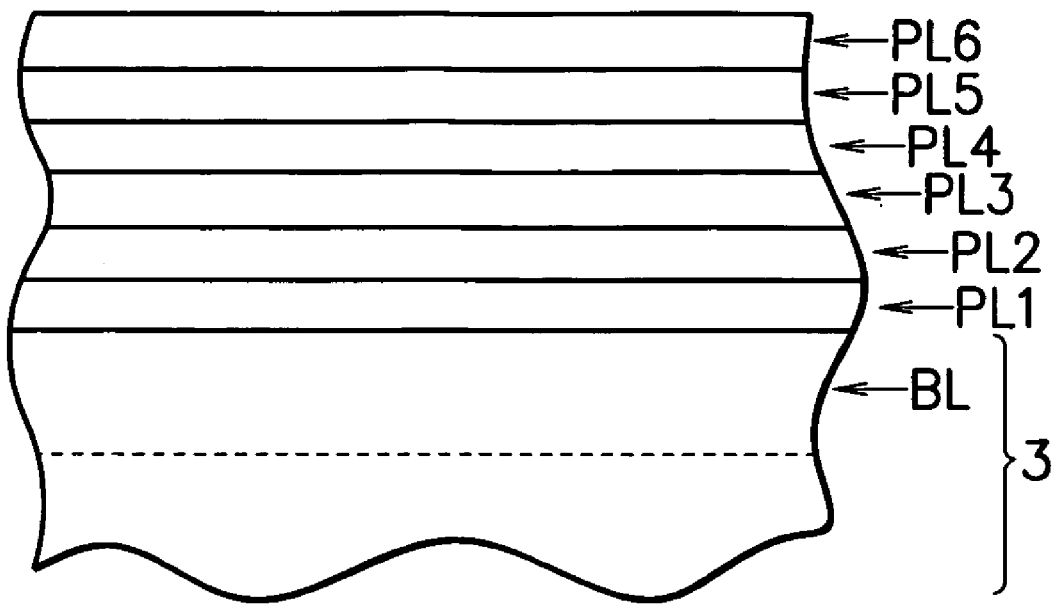
FIG. 2 is a sectional view showing a configuration example of the semiconductor integrated circuit according to the first embodiment.

FIG. 2 is a sectional view showing a configuration example of the semiconductor integrated circuit according to the first embodiment.

In FIG. 2, reference numeral 3 denotes a semiconductor substrate (chip) having the bulk layer BL. A first to a sixth wiring layers PL1 to PL6 for forming metal wiring using Cu (copper), Al (aluminum) and the like are provided above the bulk layer BL to be formed in layers (hereinafter, referred to as a first, second, third, fourth, fifth and sixth wiring layers in sequence from the side of the bulk layer BL, for convenience of explanation). The wiring formed in each of the wiring layers PL1 to PL6 is insulated from the different wiring layers by an interlayer insulation film, and is connected to the wiring of a different wiring layer by way of a via as necessary.

In the semiconductor integrated circuit according to the first embodiment, the wirings formed in the first, fifth and sixth wiring layers PL1, PL5 and PL6 are fixed wirings of which wiring patterns are unchangeable, and the wirings formed in the second, third and fourth wiring layers PL2, PL3 and PL4 are variable wirings of which wiring patterns are changeable. Namely, the first, fifth and sixth wiring layers PL1, PL5 and PL6 are the fixed wiring layers which cannot be customized, and the second, third and fourth wiring layers PL2, PL3 and PL4 are variable wiring layers capable of being customized.

In the aforementioned explanation, the fixed wirings and the variable wirings are realized in only the respective wiring layers called the fixed wiring layers and the variable wiring layers for convenience of the explanation, but the fixed wirings and the variable wirings may be realized by only the wirings formed in the wiring layers, or by only the vias provided between the wiring layers, or by combination of the wirings formed in the wiring layers and the vias provided between the wiring layers. In other words, when mentioning the fixed wiring layer and the variable wiring layer in which the fixed wiring and the variable wiring are respectively formed, they may mean only the wiring layers, or only the vias provided between the wiring layers, or the combinations of the wiring layers and the vias provided between the wiring layers.

By the wirings of the variable wiring layers capable of being customized, for example, power source can be supplied to the circuit formed in the bulk layer, and the internal logical configuration can be switched. Even the variable wiring layer capable of being customized sometimes includes the necessary wiring to cause the circuit formed in the bulk layer BL to function.

FIGS. 3A to 3E are diagrams for explaining wirings (wiring patterns) formed on the bulk patterns. FIGS. 3A to 3E show the wiring patterns respectively formed on the first to fifth bulk patterns B1 to B5.

As shown in FIGS. 3A to 3E, each of the bulk patterns B1 to B5 has a plurality of wiring patterns corresponding to each bulk pattern. The plurality of wiring patterns are respectively given codes indicating peculiar cell names of a standard cell type (for example, B1A, B1B and B1C for the wiring patterns formed on the first bulk pattern B1) as identification information, and the wiring pattern can be uniquely determined by the codes.

As for the same bulk patterns B1 to B5, it is possible to change the wiring pattern to any wiring pattern of a plurality of wiring patterns corresponding to them. For example, as the wiring pattern to be formed on the second bulk pattern B2, any one of the wiring patterns B2A, B2B, B2C and B2D can be selected and applied to each of the bulk patterns at different positions.

A plurality of wiring patterns corresponding to the same bulk pattern are different wiring patterns from each other, and a wiring pattern of the wiring for supplying power to the circuit, a wiring pattern of the wiring which connects to or does not connect to the power source to supply logic ("1" or "0") to the terminal which switches the mode inside the circuit, and the like are included in accordance with the circuit formed in the bulk layer by the bulk pattern. Accordingly, by changing the wiring pattern on the bulk pattern, the circuit function realized by the bulk pattern can be controlled (changed).

In the wiring patterns corresponding to the same bulk pattern, it is preferable that the cell size and the positions in which the input and output terminals with respect to the outside are provided are the same, namely, are fixed. For example, as shown in FIG. 4A, in the case of the wiring pattern for realizing some logic 5 of two inputs (IN1, IN2) and one output (OUT1) by the fifth bulk pattern B5, the positions where input terminals 6 and 7 and an output terminal 8 for the outside are provided are fixed, and the other wirings are made different corresponding to the logic 5 in the wiring pattern B5A' as shown in FIG. 4B. It is also preferable that an interface part between the fixed wiring layer and the variable wiring layer is similarly fixed.

Figure 5:
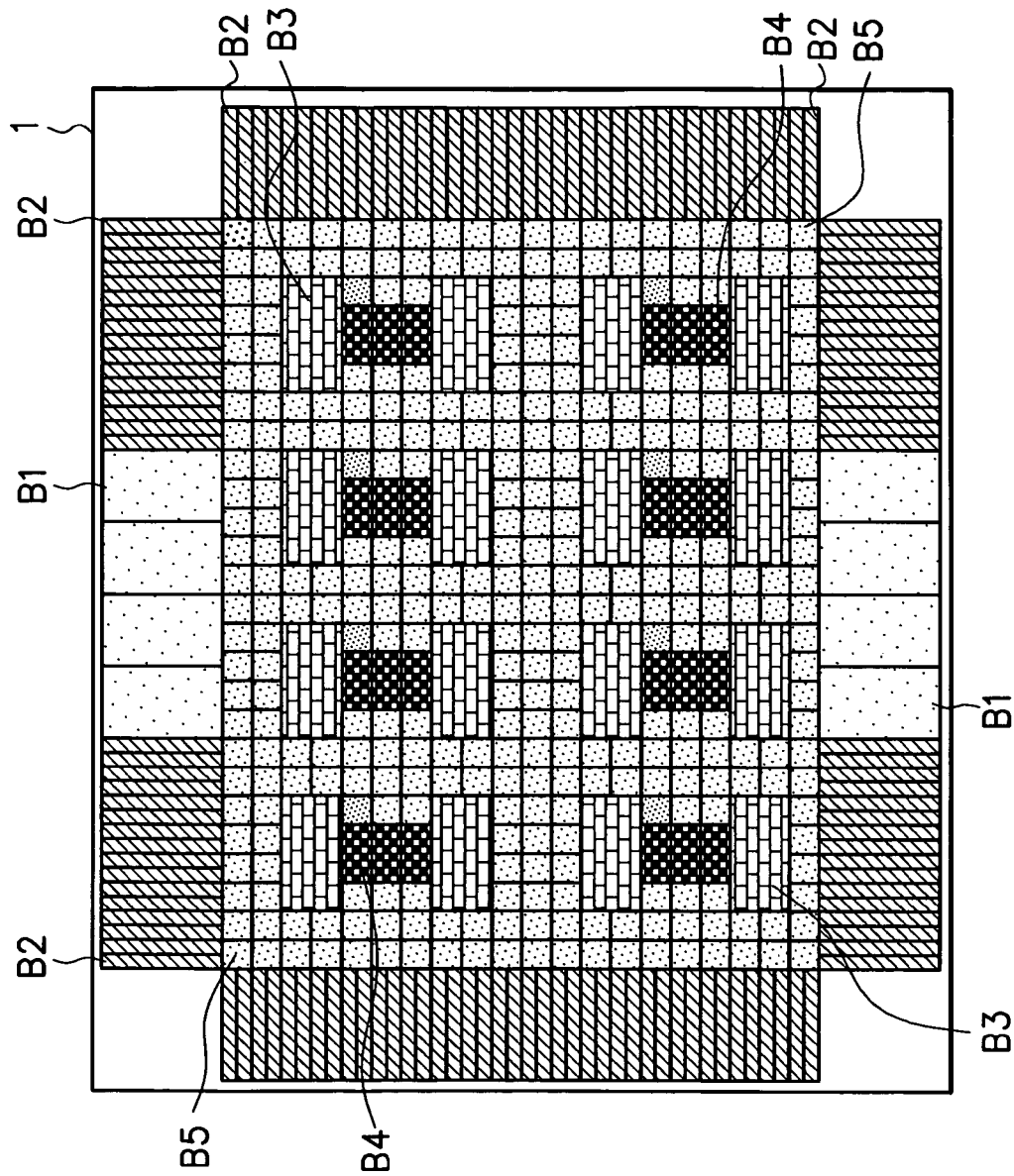
FIG. 5 is a diagram showing a concrete configuration example of the semiconductor integrated circuit according to the first embodiment.
Figure 6:
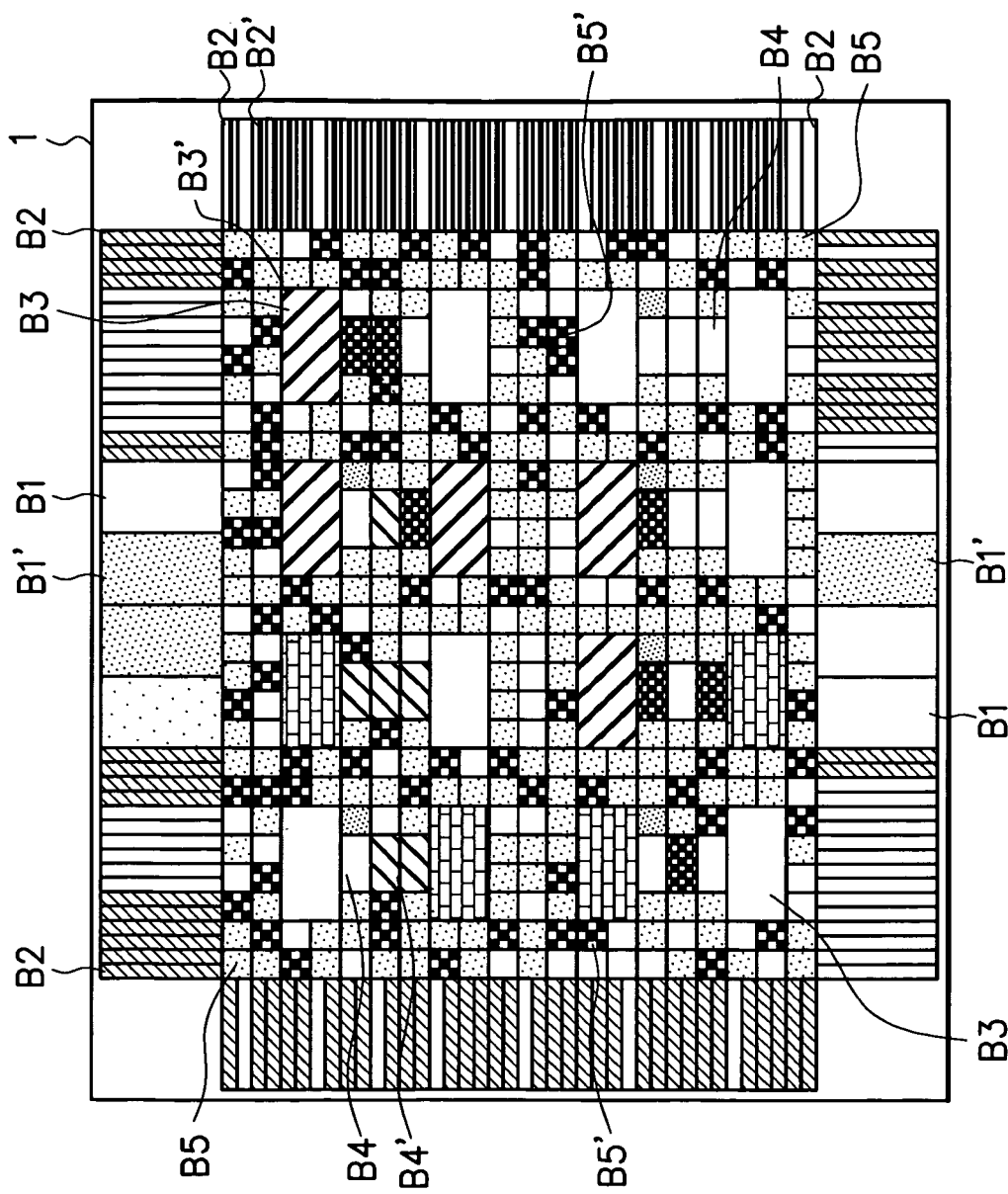
FIG. 6 is a diagram showing a concrete configuration example of the semiconductor integrated circuit according to the first embodiment.

FIGS. 5 and 6 are diagrams showing concrete configuration examples of the semiconductor integrated circuit according to the first embodiment.

FIG. 5 shows the semiconductor integrated circuit before user layout processing corresponding to the demand of a user is performed for the semiconductor integrated circuit in which each of the bulk patterns B1 to B5 is placed as shown in FIG. 1.

As shown in FIG. 5, in the semiconductor integrated circuit according to the first embodiment in the initial state before the user layout processing, the wiring pattern which is previously set as the initial value is set for each of the bulk patterns B1 to B5. In the example shown in FIG. 5, the wiring pattern B1A is set for the first bulk pattern B1, and the wiring pattern B2A is set for the second bulk pattern B2. Similarly, the wiring patterns B3A, B4A and B5A are set for the third, fourth and fifth bulk patterns B3, B4 and B5. The wiring pattern which is set as the initial value for each of the bulk patterns B1 to B5 is optionally selectable for each of the kinds of the bulk patterns B1 to B5, and it is desirable that the change amount of the wiring pattern in the user layout processing becomes small, for example.

In the semiconductor integrated circuit in the initial state before the user layout processing, flipflops (FFs), clock buffers, capacity cells (decoupling cells) for power noise countermeasure and the like are placed to be regularly arranged, and the complicated and difficult design of the crosstalk countermeasure or the like which is carried out with the user layout processing in the prior art is previously performed. A wiring pattern for supplying a clock signal (wiring pattern according to a clock tree), a wiring pattern for a test circuit and a wiring pattern for power supply are included in some limited wiring layer (for example, the first wiring layer PL1) in the wiring pattern shown in FIG. 3, so that these wirings may be made into the semiconductor integrated circuit at the stage of the initial state before the user layout processing, or they may be used in only a necessary spot in accordance with the demand of the user.

FIG. 6 shows the semiconductor integrated circuit after the user layout processing is performed for the semiconductor integrated circuit shown in FIG. 5.

In the example shown in FIG. 6, the wiring patterns for some bulk patterns B1' are replaced (changed) with B1B from B1A, and the wiring patterns for some bulk patterns B2' are changed to B2D from B2A. The wiring patterns for some third, fourth and fifth bulk patterns B3', B4' and B5' are changed to B3D from B3A, to B4D from B4A and to B5D from B5A, respectively.

The bulk patterns B1", B2", B3", B4" and B5" of which wiring patterns are not shown are unused bulk patterns, and the bulk patterns themselves are left but the wirings may be deleted to be released as wiring channels for the other wirings. Replacement of the wiring pattern in the user layout processing is performed by replacing the code attached to the wiring pattern as the identification information though the details will be described later.

As above, in the semiconductor integrated circuit in the first embodiment, with the bulk patterns kept common, namely, with the structure of the bulk layer (transistor layer) unchanged but fixed, only the code attached to the wiring pattern formed on the wiring layer on each of the bulk patterns is changed, whereby the wiring pattern can be changed and the circuit function to be realized (function of the macro) can be easily switched.

In the semiconductor integrated circuit in the first embodiment, the portion changeable in accordance with the demand of the user (customizable portion) is limited to a part of the wiring layer, and the other parts including the bulk layer are made common. Therefore, design can be easily made in a short time, and when the semiconductor integrated circuit is actually manufactured, the semiconductor integrated circuit having a desired function can be manufactured by making only masks (reticles) according to the wiring layers of the changeable portion at the user side.

For example, in the case of PLL macro (the first bulk pattern B1), change of VCO (Voltage Control Oscillator) frequency, setting of the frequency division ratio, change extension and non-extension of the feedback terminal to an outside, change in making each block effective and disabled when a plurality of blocks are included inside, and the like can be performed by only the change of the wiring patterns. In the case of the I/O macro (the second bulk pattern B2), change of the kind of I/O and driving force, setting of the number of transmit-receive channels and change of the fine power control in the case of high speed I/O (HSIO) as an example, switch of Class 1 and Class 2 (change in the driving force of the I/O cell) in the case of the I/O in conformity with the SSTL standard which is the memory interface standard, change of the operation voltage and the like can be performed.

In the case of the RAM macro (the third, fourth bulk patterns B3, B4), change of the word bit circuit configuration and speed and power control are performed, and almost all wiring layers can be opened when they are unused. In the case of the unit cell (the fifth bulk pattern B5), automatic clip of VDD (power supply potential)/VSS (reference potential) of some input terminals, change of driving force, Rise/Fall characteristic of gate delay, reinforcement by holding of a follow pin (power supply line) and backing, opening as the wiring channel by releasing the previously set logic or reallocation of the other logic, and the like can be performed.

Next, a layout design method of the semiconductor integrated circuit in the first embodiment will be explained.

FIGS. 7A and 7B are diagrams schematically showing the layout design method of the semiconductor integrated circuit in the first embodiment.

FIG. 7A shows a design method of the semiconductor integrated circuit in an initial state as shown in FIG. 5.

In the design of the semiconductor integrated circuit in the initial state, initial value selection processing P1 of the wiring patterns is performed by referring to bulk pattern placement data 71 in the frame 1, which is the placement information of the bulk patterns in the frame 1 with the bulk patterns as shown in FIG. 1 placed in the entire frame 1, and a wiring pattern table 72 for each bulk showing a plurality of wiring patterns corresponding to the bulk pattern as shown in FIG. 3.

In the initial value selection processing P1 of the wiring pattern, the wiring pattern is selected for each bulk pattern in accordance with the initial value previously set from the wiring pattern table 72, and is set as the wiring pattern for the bulk pattern. By this processing P1, initial wiring pattern set frame data 73 in which the same wiring pattern is set for each bulk pattern as shown in FIG. 5 is obtained.

FIG. 7B shows a user layout design method according to a desired semiconductor integrated circuit corresponding to the demand of a user.

In the user layout design, user layout processing P2 is performed by referring to the initial wiring pattern set frame data 73 obtained as described above and the wiring pattern table 72 for each bulk.

In this user layout processing P2, a code of a suitable wiring pattern is inputted for each bulk pattern placed in the frame 1, and based on the inputted code of the wiring pattern, the wiring pattern of each of the bulk patterns is changed to the suitable wiring pattern from the wiring pattern set as the initial value and is set, so that the initial wiring pattern set frame becomes a desired semiconductor integrated circuit corresponding to the demand of the user. The codes of the wiring patterns for all the bulk patterns placed in the frame 1 may be inputted, or the codes of the wiring patterns for only the bulk patterns requiring replacement of the wiring patterns may be inputted.

By the user layout processing P2, user layout completion frame data 74 which realizes a desired circuit function corresponding to the demand of the user as shown in FIG. 6 is obtained. Based on this user layout completion frame data 74, only the masks relating to the wiring patterns formed in the variable wiring layers are produced, whereby the desired semiconductor integrated circuit corresponding to the demand of the user can be manufactured.

Next, a layout design method of the semiconductor integrated circuit in the first embodiment will be explained in detail.

Figures 8A, 8B:
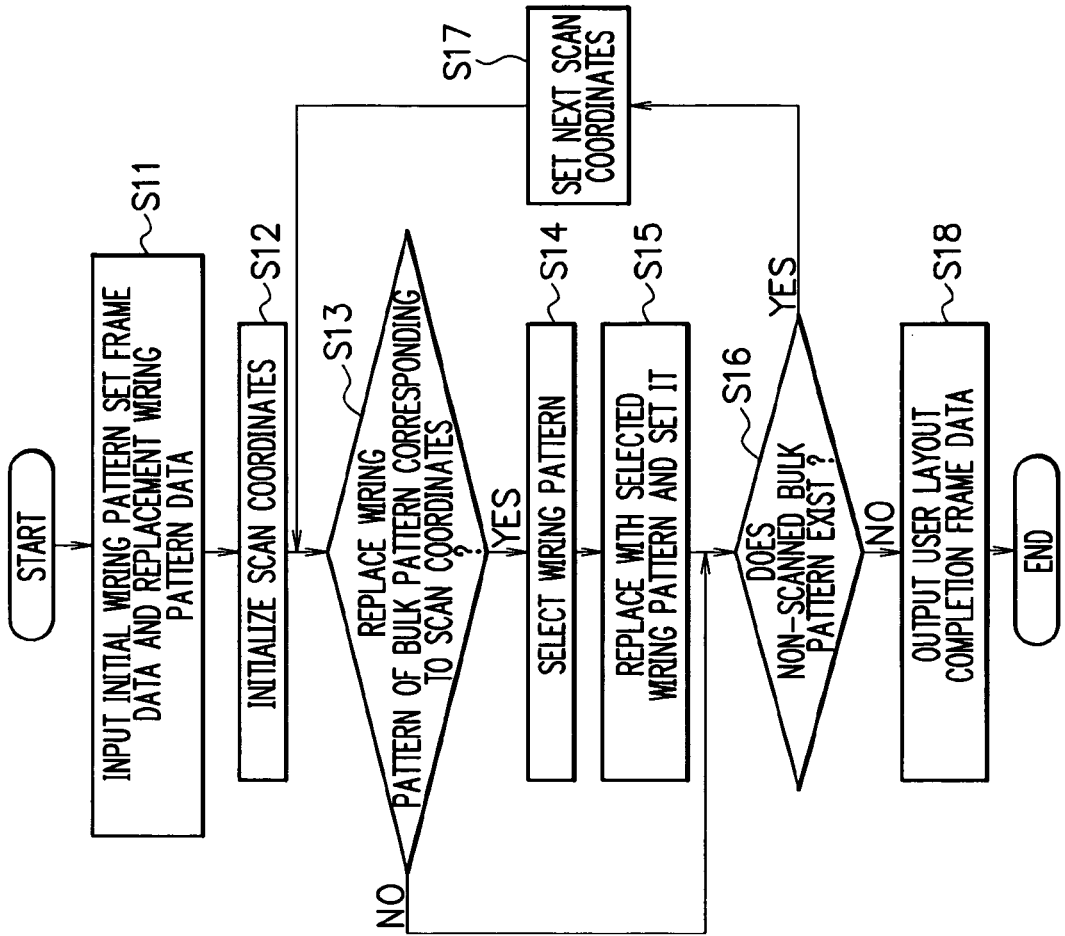
FIGS. 8A and 8B are flowcharts showing the layout design method of the semiconductor integrated circuit in the first embodiment.

FIGS. 8A and 8B are flowcharts showing a layout design method of the semiconductor integrated circuit in the first embodiment, FIG. 8A corresponds to the design method shown in FIG. 7A, and FIG. 8B corresponds to the design method shown in FIG. 7B.

In FIG. 8A, in step S1, the bulk pattern placement data and the initial values of the wiring patterns (codes of the initial wiring patterns) are inputted.

Next, in step S2, the wiring patterns corresponding to the initial values of the wiring patterns inputted in step S1 are selected by referring to the wiring pattern table for each bulk.

In step S3, the wiring pattern selected in step S2 is set as the initial wiring pattern of the bulk pattern.

Subsequently, in step S4, it is determined whether the bulk pattern for which the initial wiring pattern is unset exists or not. When the bulk pattern for which the initial wiring pattern is unset exists as a result of this determination, the flow returns to step S2, and the aforementioned processing is carried out again.

On the other hand, when the bulk pattern for which the initial wiring pattern is unset does not exist as a result of the determination in step S4, namely, when setting of the initial wiring pattern is finished for all the bulk patterns, the initial wiring pattern set frame data is generated and outputted, whereby the processing is completed in step S5.

In FIG. 8B, in step S11, the initial wiring pattern set frame data and the replacement wiring pattern data are inputted. Here, the replacement wiring pattern data is the data showing the codes of the wiring patterns for realizing the function corresponding to the demand of the user in the semiconductor integrated circuit.

In step S12, the scan coordinates for sequentially scanning the bulk patterns placed in the frame 1 one by one is initialized.

Next, in step S13, the bulk pattern corresponding to the scan coordinates is scanned, and it is determined whether the replacement of the wiring pattern is performed or not. As the result of this determination, when the replacement of the wiring pattern is to be performed, the flow goes to step S14, and when the replacement is not to be performed, the flow goes to step S16.

In step S14, the wiring pattern table of the targeted bulk pattern is referred to, and the wiring pattern corresponding to the code of the wiring pattern inputted as the replacement wiring pattern data in step S11 is selected.

In step S15, the wiring pattern of the targeted bulk pattern is replaced with the wiring pattern selected in step S14 and set.

In step S16, it is determined whether there is a non-scanned bulk pattern which is not scanned or not. As a result of this determination, when there is the non-scanned bulk pattern, the next scan coordinates are set in step S17, and the flow returns to step S13.

On the other hand, when there is not a non-scanned bulk pattern as a result of the determination in step S16, the user layout completion frame data is generated and outputted in step S18, and the processing is completed.

In the first embodiment, the placement of the bulk patterns shown in the FIG. 1 is one example, and if only the bulk patterns are laid on the inside of the frame 1, their placement is optional. For example, more PLL macros (the first bulk patterns B1) may be disposed, or more RAM macros (the third or the fourth bulk patterns, B3 or B4) may be placed. Further, a plurality of placement patterns of different bulk patterns are held as the data, and one may be selected from them. The number of wiring patterns corresponding to each bulk pattern of which example shown in the FIG. 3 is optional.

Figure 10:
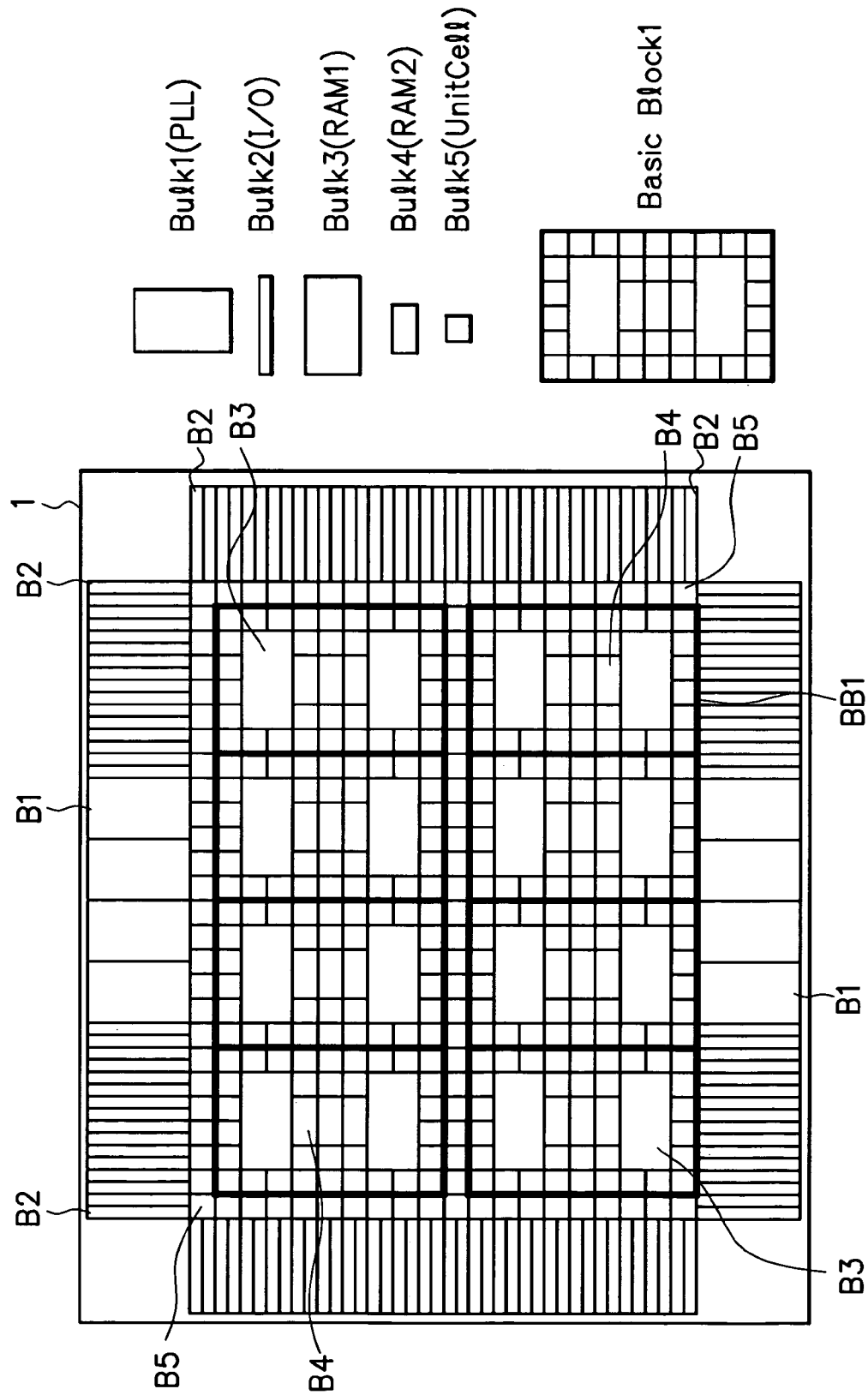
FIG. 10 is a diagram showing another configuration example of the semiconductor integrated circuit according to the first embodiment.

In the aforementioned first embodiment, each of the bulk patterns B1 to B5 is independently placed in the frame 1, but as shown in FIG. 10, for example, the combination of two of the third bulk patterns B3, three of the fourth bulk patterns B4 and 32 of the fifth bulk patterns B5 may be disposed as the basic block BB1 similarly to the bulk pattern. The basic block BB1 shown in FIG. 10 is one example, and the basic block BB1 is not limited to this.

Second Embodiment

Next, a second embodiment of the present invention will be explained.

The second embodiment is to reduce the time and cost relating to the development of a semiconductor integrated circuit to reduce the burden by preparing the previously designed information (placement information of the bulk patterns, wiring information and the like) for realizing common circuit function by the user design such as the circuit function which can be used by a number of users, for example, as a library, and carrying out design by using this library.

FIG. 11 is a diagram showing a configuration example of a semiconductor integrated circuit according to the second embodiment of the present invention, and more specifically, it shows a configuration example of a bulk layer in the semiconductor integrated circuit.

As shown in FIG. 11, in the semiconductor integrated circuit according to the second embodiment, a plurality of minimum kinds of bulk patterns B1 to B5 are disposed in the frame 1 to be laid on the region where the bulk patterns are formable. Accordingly, in the semiconductor integrated circuit according to the second embodiment, some circuit functions are formed in all parts (regions) where the bulk patterns of the bulk layer are laid in the frame 1 similarly to the first embodiment.

In the second embodiment, when the bulk patterns B1 to B5 are placed in the frame 1, the basic block BLK is configured by combining plurality of bulk patterns which are selected and fixed, and the basic block BLK is placed in a predetermined region in the frame 1. At this time, as many basic blocks BLK as can be placed are placed to be laid on a predetermined region in the frame 1. In this embodiment, a firm macro (library) which is previously designed and realizes the predetermined circuit function by using N (N is an optional natural number) of the basic blocks BLK is provided.

As for the remaining region in the predetermined region, which remains after the basic blocks BLK are placed in the predetermined region in the frame 1, the bulk patterns (for example, the fifth bulk patterns B5) may be properly placed, or it may be made the vacant region without placing the bulk patterns.

For example, in the example shown in FIG. 11, one basic block BLK is configured by combining one of the third bulk pattern (first RAM macro) B3, two of the fourth bulk patterns (second RAM macro) B4, and 18 of the fifth bulk patterns (unit cell) B5. In a predetermined region in the frame 1, the basic blocks BLK are placed to be laid on the region, and 16 of the basic blocks BLK are placed. Here, the predetermined region in the frame 1 where the basic blocks BLK are placed is the region which is obtained by excluding the region where the bulk patterns of which use by the user is prohibited are placed from the region where the bulk patterns B1 to B5 are formable in the frame 1, and is, for example, is the region where the user can realize an optional circuit function in the frame 1, except for the region where the first bulk patterns (PLL macro) B1 and the second bulk patterns (I/O macro) B2 are disposed (in other words, the region where the bulk patterns relating to the external interface and the bulk patterns relating to the clock control are disposed).

In the example shown in FIG. 11, the fifth bulk patterns B5 are placed in the remaining region in the predetermined region.

The stacked structure relating to the bulk layer BL and the wiring layers PL1 to PL6 in the semiconductor integrated circuit according to the second embodiment is the same as that in the semiconductor integrated circuit according to the first embodiment shown in FIG. 2, and therefore, the explanation will be omitted.

Figure 12A:
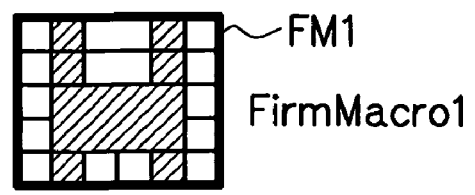
FIGS. 12A, 12B and 12C are diagrams showing one examples of firm macros.
Figure 12B:
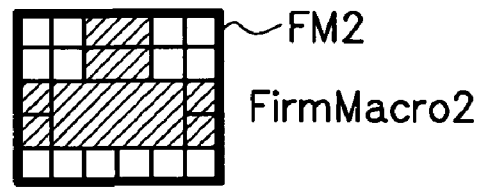
Figure 12C:
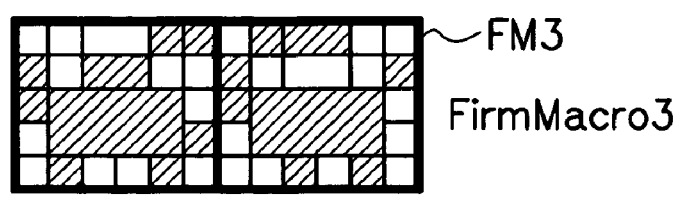

FIGS. 12A, 12B and 12C are diagrams showing examples of firm macros for realizing specific circuit functions by using N of the basic blocks BLK as described above. The firm macro is the one in which the information which is obtained by previously performing the layout design for realizing the specific circuit function is registered, and the common circuit function with the design frequently used by the users, for example, is registered as the firm macro. For example, as one example of the circuit function realizable by using the firm macro, the CPUs and processors for an AV device, a device for a server, a storage device, image processing and the like, a processing circuit (an interface circuit of the high speed I/O) of the data link layer in conformity with the standard of each high speed I/O and the like are cited.

The firm macro has the placement information of the bulk patterns and wiring information which are used for realizing the predetermined circuit function in the basic block BLK unit as the previously designed data. The placement information of the bulk patterns includes the information relating to the placement coordinates and the kind of bulk patterns, and the wiring information includes the information relating to the coordinates showing the positions where the wirings are formed and the wiring layers. The coordinate values in these kinds of information are the coordinate values with the predetermined position in the basic block BLK as the reference.

In the examples shown in FIGS. 12A to 12C, the bulk patterns having the wiring for realizing predetermined circuit functions in the wiring layers PL1 to PL6, namely, the bulk patterns which are used for realizing the circuit functions and in which wirings are formed in the wiring layer are shown by applying hatching thereto.

FIG. 12A shows a first firm macro FM1 which realizes a specific circuit function by using one basic block BLK (the specific circuit function is registered in one basic block BLK). The first firm macro FM1 realizes the specific circuit function by one of the third bulk pattern B3 and six of the fifth bulk patterns B5.

FIG. 12B shows a second firm macro FM2 which realizes a specific circuit function by using one basic block BLK. The second firm macro FM2 realizes the specific circuit function by one of the third bulk pattern B3, two of the fourth bulk patterns B4 and four of the fifth bulk patterns B5.

FIG. 12C shows a third firm macro FM3 which realizes a specific circuit function by using two basic blocks BLK. The third firm macro FM3 realizes the specific circuit function by one of the third bulk pattern B3, one of the fourth bulk pattern B4 and seven of the fifth bulk patterns B5 in one of the basic blocks BLK and one of the third bulk pattern B3, one of the fourth bulk pattern B4 and six of the fifth bulk patterns B5 in the other basic block BLK.

Figure 13:
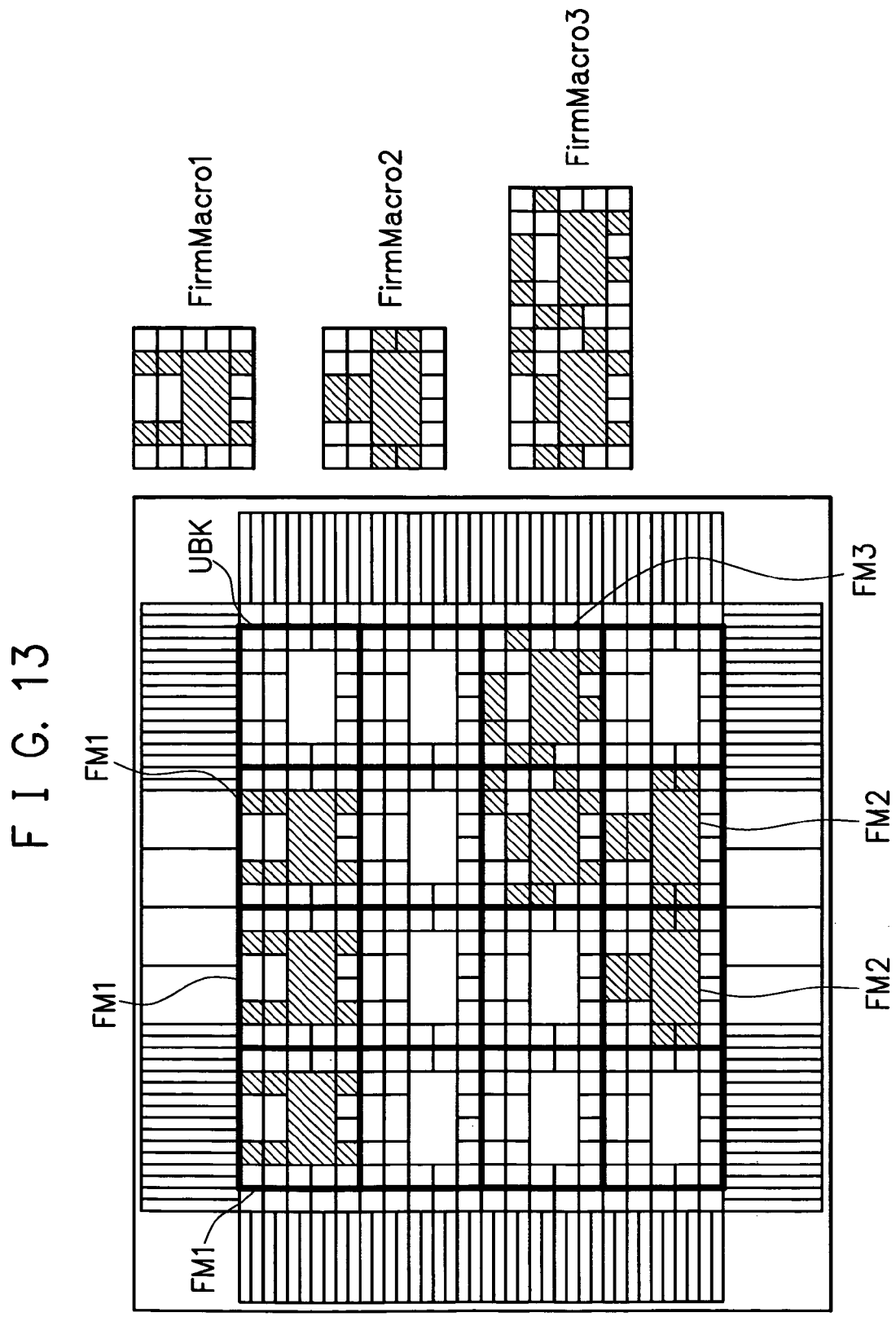
FIG. 13 is a diagram showing a concrete configuration example of the semiconductor integrated circuit according to the second embodiment.

FIG. 13 is a diagram showing a concrete configuration example of the semiconductor integrated circuit according to the second embodiment.

FIG. 13 shows the semiconductor integrated circuit when the firm macros FM1 to FM3 are assigned to the basic blocks BLK in the frame 1 corresponding to the demand of a user.

Assignment of the firm macros FM1 to FM3 is performed by applying the placement information of the bulk patterns and wiring information according to the firm macros FM1 to FM3 to the basic blocks BLK, to which assignment is designated, by the basic block BLK unit and reflecting them (hereinafter also called "return"). Thereby, the designated optional basic block BLK can be replaced with the specific circuit function such as a processor and a high speed I/O interface circuit, for example.

When the placement information and wiring information of the bulk patterns of the firm macros FM1 to FM3 are applied to the basic blocks BLK, the coordinate values in the placement information of the bulk patterns and the wiring information are converted based on the placement position (placement coordinates) of the designated basic blocks BLK in the frame 1. Namely, the coordinate values in the placement information of the bulk patterns and the wiring information of the firm macros FM1 to FM3 are converted and returned in accordance with the position of the designated basic block BLK. This processing is possible by using the design system such as a CAD system having the coordinate conversion (calculating) function. When the placement information of the bulk patterns and wiring information are returned to the designated basic block BLK, both kinds of information may not be returned, and only the placement information of the bulk patterns may be returned and rewiring may be performed as for wiring.

The user may form optional circuit functions in the bulk patterns B1 to B5 and the wiring channels of the basic blocks (in FIG. 13, basic blocks UBK) to which the firm macros FM1 to FM3 are not assigned by making them freely usable by the user, or they may be made unusable by the user. Further, even when the firm macros FM1 to FM3 are assigned to the basic blocks, the unused bulk patterns B1 to B5 and wiring channels in the firm macros FM1 to FM3 may be made release so that the user can use them freely.

As described above, in the semiconductor integrated circuit according to the second embodiment, the information of the firm macros FM1 to FM3 (placement information of the bulk patterns, wiring information and the like) which are previously designed to realize common circuit functions in the design of the user is prepared as a library, and the library is used when the design of the semiconductor integrated circuit is performed, whereby a basic circuit design is completed by only an easy operation of applying the already existing placement information and wiring information for the basic block without making the design of the placement of the bulk patterns and their wirings as to the circuit functions provided as the firm macros FM1 to FM3, and a desired circuit function can be realized. Accordingly, the burden can be reduced sharply by reducing the time period and cost relating to the development of the semiconductor integrated circuit. The same effects as the first embodiment can be also obtained.

Next, a layout design method of the semiconductor integrated circuit in the second embodiment will be explained.

Figure 14:
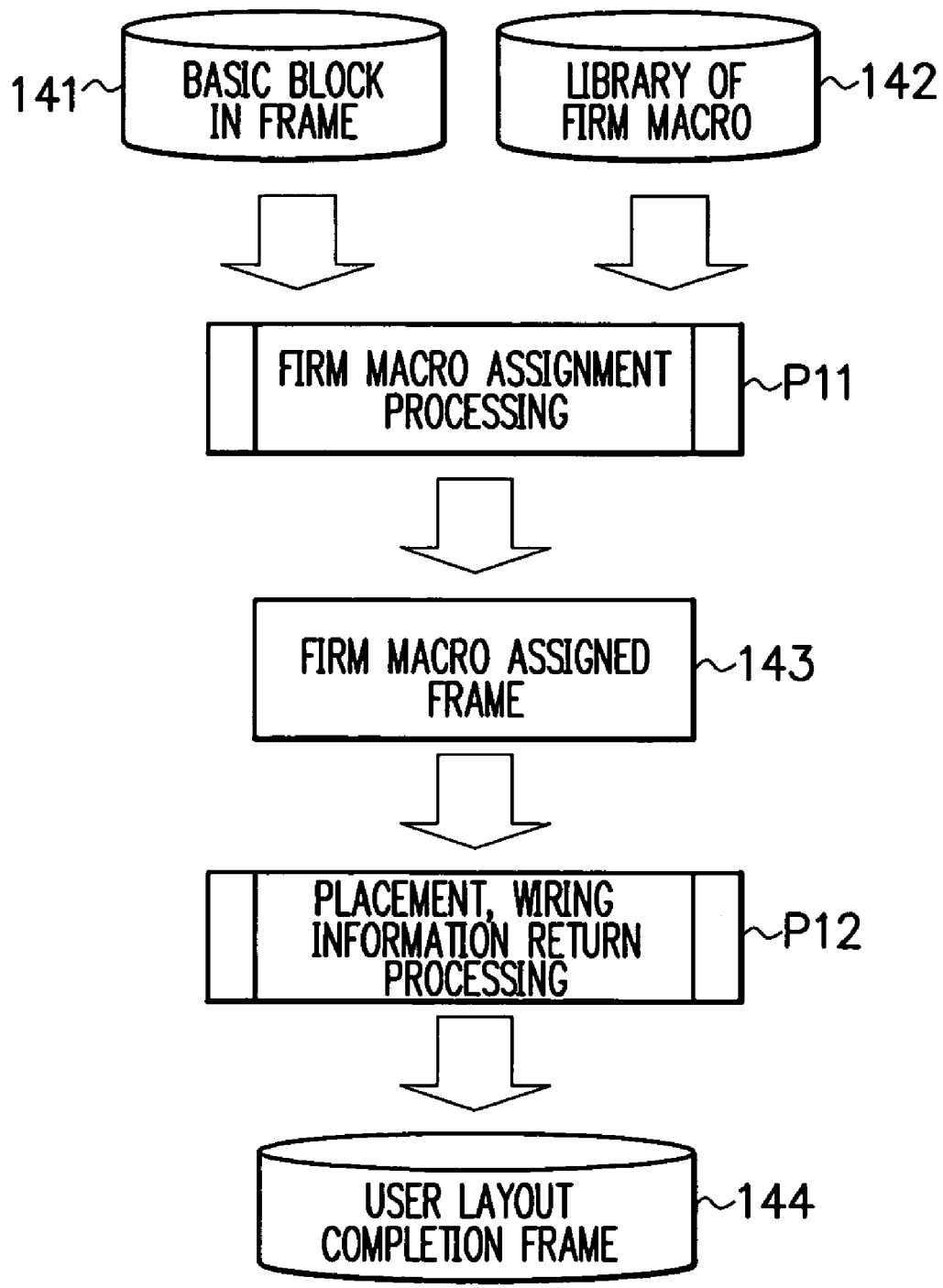
FIG. 14 is a diagram schematically showing a layout design method of the semiconductor integrated circuit in the second embodiment.

FIG. 14 is a diagram schematically showing the layout design method of the semiconductor integrated circuit in the second embodiment.

In the design of the semiconductor integrated circuit according to the second embodiment, firm macro assigning processing P11 is performed by referring to basic block placement data 141 that is the placement information of the basic blocks in the frame 1 which are placed so that the basic blocks are laid on predetermined regions in the frame 1 as shown FIG. 11, and a firm macro library 142 showing the firm macros as shown in FIG. 12.

In the firm macro assigning processing P11, the previously designed firm macro is selected from the library 142 of the firm macros in accordance with the set value of the user for each basic block in the frame 1, and it is set as the firm macro for the basic block. By this processing P11, firm macro assigned frame data 143 in which the firm macro is assigned to each basic block as shown in FIG. 13.

Further, placement/wiring information return processing P12 for returning the placement information of the bulk patterns and wiring information according to the firm macro to the designated basic block is performed.

The placement/wiring information return processing P12 is the processing of returning both of the placement information of the bulk patterns and wiring information or only the placement information of the bulk patterns to the basic block for each assigned firm macro when wirings such as clock wiring and test circuit wiring which already exist in the basic block are used in the layout. By the processing P12, the user layout completion frame data 144 having the layout of the firm macros realizing the desired circuit functions in the frame 1 in accordance with the setting by the user is obtained.

Next, the layout design method of the semiconductor integrated circuit in the second embodiment will be explained in detail.

FIG. 15 is a flowchart showing the layout design method of the semiconductor integrated circuit in the second embodiment.

First, in step S21, a set value of a firm macro showing the firm macro which is assigned to the basic block disposed in a predetermined region in the frame 1 is inputted.

In step S22, scan coordinates for sequentially scanning the basic blocks placed in the frame 1 one by one is initialized.

Next, in step S23, the firm macro which is assigned to the basic block corresponding to the scan coordinates is selected based on the set value of the firm macro inputted in step S21.

In step S24, it is determined whether the wiring information of the firm macro selected for the basic block is returned or not. As a result of this determination, when the wiring information of the firm macro is returned, the flow goes to step S25, and the wiring information of the firm macro is returned to the basic block. When the wiring information of the firm macro is not returned on the other hand in a case where wirings such as a clock wiring and a test circuit wiring are already used in the layout in the basic block, step S25 is skipped.

Subsequently, in step S26, the placement information of the bulk patterns of the selected firm macro is returned to the basic block.

Namely, in the processing of steps S24 to S26, only the placement information of the bulk patterns in the firm macro is returned to the basic block when the wiring information of the firm macro is not returned due to the fear of occurrence of problem to the already existing wiring in a case where the wirings such as the clock wiring and the test circuit wiring are already used in the layout in the basic block and the like, and otherwise, both of the placement information of the bulk patterns and the wiring information in the firm macro are returned to the basic block.

In step S27, it is determined whether there is non-scanned basic block which is not scanned or not. As a result of this determination, when the non-scanned basic block exists, the next scan coordinates are set in step S28, and the flow returns to step S23.

When the non-scanned basic block does not exist as a result of the determination in step S27, the user layout completion frame data is generated and outputted and the processing is completed in step S29.

In the aforementioned second embodiment, the semiconductor integrated circuit in which one kind of basic blocks BLK are placed to be laid on the predetermined region in the frame 1 is shown as one example as shown in FIG. 11, but the present invention is not limited to this, and a plurality of kinds of basic blocks may be placed in the predetermined region in the frame 1. When a plurality of kinds of basic blocks are used, the size of each of the basic blocks may be the same or may be different. Namely, the sizes of the basic blocks are optional.

In the semiconductor integrated circuit according to the second embodiment shown in FIG. 11, the basic blocks placed in the predetermined region in the frame 1 are all placed by being aligned in the same direction, but the basic blocks may be placed by being rotated by a predetermined angle with a predetermined position in the basic blocks as the centers, or by being inverted to be symmetrical with respect to certain axes in the basic blocks. When the firm macro is assigned to the basic block which is placed by being rotated or inverted, the coordinate conversion processing corresponding to the rotation or inversion is also performed for the coordinate values in the placement information of the bulk patterns and wiring information of the firm macro.

For example, as shown in FIG. 16, two kinds of basic blocks BLK1 and BLK2 which are the first basic block BLK1 combining one of the third bulk pattern B3, two of the fourth bulk patterns B4 and 18 of the fifth bulk patterns B5 and the second basic block BLK2 combining one of the fourth bulk pattern B4 and 20 of the fifth bulk patterns B5 may be placed in the predetermined region in the frame 1. For example, in FIG. 16, a basic block BLK1' which is the basic block BLK1 rotated or symmetrically moved with the point or the axis inside the basic block BLK1 as the reference may be disposed together with the basic block BLK1.

As described above, there are various placement methods of the basic blocks, and therefore, a plurality of different placement patterns of the basic blocks are held as the data (frame library), and one may be selected from them when the semiconductor integrated circuit is designed.

The firm macros FM1 to FM3 shown in FIGS. 12 and 13 and their placement example are only examples, and are not limited to them. For example, as the firm macro FM4 shown in FIG. 16, one firm macro may be configured by using the different basic blocks BLK1 and BLK2. When one firm macro is constituted by a plurality of basic blocks, it is not necessary that the basic blocks are combined in contact with each other, in other words, it is not necessary that any one side of the basic block overlays any one side of the other basic block, and as the firm macro FM3' shown in FIG. 16, the basic blocks to which the firm macro is assigned may be separated. When the basic blocks to which the firm macro is assigned are separated, the wiring between the basic blocks corresponding to this firm macro is be rewired.

When one firm macro is constituted by a plurality of basic blocks, the wiring between the basic blocks is basically rewired. However, when the spaces (gaps) between the basic blocks including the firm macro are the same, even the wiring between the basic blocks is not rewired, but the wiring information of the firm macro may be used.

When a fear of the occurrence of the problem to the already existing wiring exists in such a case as the wirings such as a clock wiring and a test circuit wiring are already used in the layout in the basic block in the second embodiment, the wiring information of the firm macro is not returned to all the bulk patterns in the basic block, but the wiring information of the firm macro may not be returned to only the portion where the problem occurs. The wiring information of the firm macro is always returned to the basic block irrespective of whether the problem occurs or not, and rewiring may be performed for only the illegal portion such as violation short detected by the physical verification (design routine check, electrical connection check) and the like.

In the layout design method of the semiconductor integrated circuit in the aforementioned second embodiment, the data which is obtained after completion of the assignment processing P11 of the firm macro and the placement/wiring information return processing P12 is made the user layout completion frame data, but the user layout for realizing the individual circuit function corresponding to the demand of the user may be further performed by using the unused bulk patterns B1 to B5 and wiring channels in the frame 1 (the bulk patterns B1 to B5 and the wiring channels of the basic block to which the firm macro is not assigned, and the unused bulk patterns B1 to B5 and the wiring channels in the firm macro). The outline of the layout design method in this case is shown in FIGS. 17A and 17B.

FIGS. 17A and 17B are diagrams schematically showing another layout design method of the semiconductor integrated circuit in the second embodiment. In FIGS. 17A and 17B, the components corresponding to the components shown in FIG. 14 are given the same reference numerals and characters.

The layout design method of the semiconductor integrated circuit shown in FIG. 17A is the same as the layout design method of the semiconductor integrated circuit shown in the FIG. 14 though it differs from the semiconductor integrated circuit in FIG. 14 in the respect that the data obtained after completion of the assignment processing P11 of the firm macro and the placement/wiring information return processing P12 is called the initial layout completion frame data 144' for convenience of explanation, and therefore the explanation thereof will be omitted.

FIG. 17B shows a user layout design method for realizing the individual circuit function corresponding to the demand of the user.

In the user layout design, the user layout processing P23 is performed by referring to the initial layout completion frame data 144' which is obtained after the firm macro assignment processing P11 and the placement/wiring information return processing P12 are completed as shown in FIG. 17A and the wiring pattern table 175 for each bulk.

In this user layout processing P23, setting processing of the wiring pattern for realizing the circuit function corresponding to the demand of the user is performed by using the unused bulk patterns and wiring channels which can be freely used by the user in the initial layout completion frame to which assignment of the firm macro is performed. More specifically, the code of a suitable wiring pattern is inputted for each unused bulk pattern in the frame 1, and based on inputted code of the wiring pattern, the wiring for each bulk pattern is selected to set suitable wiring patterns.

By performing the setting processing of the wiring patterns relating to the unused bulk patterns in the user layout processing P23, user layout completion frame data 176 which realizes the individual circuit function corresponding to the demand of the user is obtained by using the unused bulk patterns B1 to B5 and wiring channels after assignment of the firm macro.

Third Embodiment

Next, a third embodiment of the present invention will be explained.

When two TAP (Test Access Port) controllers in compliance with JTAG (boundary scan test), for example, are included in a semiconductor integrated circuit, it is general to construct the two TAP controllers to be switched by using a multiplexer. By using the multiplexer, the two TAP controllers included inside the chip are seen to be exclusive from the outside of the chip, and the number of external pins (terminals) (the number of external I/Os) can be reduced.

When the aforementioned circuit is realized, however, the logic (net list) relating to the two TAP controllers and the multiplexer is provided from the manufacturer side or the like, for example, and is common irrespective of users in the conventional semiconductor integrated circuit, but the actual layout design is carried out freely by each user. Namely, the layout design is performed by each user though the same circuit function is realized, which reduces the development efficiency and is one of the factors which prevent the reduction in cost required for development, manufacture and the like.

Thus, the third embodiment which will be explained hereinafter reduces the time and cost relating to development of the semiconductor integrated circuit and reduces the burden by preparing the previously designed information for realizing the test circuit function (placement information of the bulk patterns, wiring information and the like) as the library, and performing design by using this. The user makes a part of the configuration provided as the library changeable, and thereby, general versatility is enhanced.

It should be noted that in the following explanation, only the characteristic circuit configuration of the semiconductor integrated circuit according to the third embodiment will be explained, and since the entire configuration and the like are the same as those of the semiconductor integrated circuits according to the first and second embodiments, the explanation thereof will be omitted.

FIG. 18 is a diagram showing a configuration example of the semiconductor integrated circuit according to the third embodiment of the present invention. In FIG. 18, only the elemental characteristic of the semiconductor integrated circuit according to the third embodiment is shown, which corresponds to a part of the configuration in the semiconductor integrated circuit of which entire configuration is shown in the first and second embodiments.

In FIG. 18, reference numeral 192 denotes a multiplexer for the JTAG, reference numeral 193 denotes a first TAP controller (TAP-A) and reference numeral 194 denotes a second TAP controller (TAP-B). The TAP-A193 is a TAP controller provided for the test of the entire chips, for example, and the TAP-B194 is a TAP controller provided for the processor, for example.

The multiplexer 192 is connected to an external terminal (pin) IO11 (input IN1) by a wiring via a buffer BUF11, and is connected to an external terminal IO12 (output OUT1) by a wiring via a buffer BUF12. The multiplexer 192 and the TAP-A193 are connected by a wiring via buffers BUF21 and BUF22. Similarly, the multiplexer 192 and the TAP-B194 are connected by a wiring via buffers BUF31 and BUF32.

A test mode signal TST is inputted into the multiplexer 192 from an outside, and which TAP controller of TAP-A193 or TAP-B194 is switchable. The TAP-A193 and TAP-B194 can be switched in accordance with the test mode signal TST, namely, which of the TAP-A193 or TAP-B194 is connected to the external terminals IO11 and IO12 can be switched.

The wiring via the buffer BUF11, which connects the multiplexer 192 and the external terminal IO11, the wirings via the buffers BUF21 and BUF31, which respectively connect the multiplexer 192 and the TAP-A193 and TAP-B194 are constituted by a plurality of wirings respectively corresponding to the test data input TDI in compliance with the IEEE1149.1 standard (so-called JTAG), test clock TCK, test mode select TMS and test reset nTRST, but they are omitted in FIG. 18 for convenience of explanation. The wiring via the buffer BUF12, which connects the multiplexer 192 and the external terminal IO12, and the wirings via the buffers BUF22 and BUF32, which respectively connect the multiplexer 192 and the TAP-A193 and TAP-B194 correspond to the test data output TDO in compliance with the IEEE1149.1 standard.

Here, in this embodiment, the placement information of the bulk patterns and wiring information which are used for realizing the circuit configuration of which example is shown in FIG. 18 are registered as the previously designed data (library) as in the firm macro in the second embodiment. Accordingly, the bulk patterns (structure of the bulk layers) of the macros which realize the circuit functions of the multiplexer 192, the TAP-A193, the TAP-B194 and each of the buffers are fixed irrespective of the users, and cannot be changed at the user side.

The wirings between the respective macros are fixed and cannot be changed at the user side, but the wiring between the multiplexer 192 (buffers BUF31 and BUF32) and the TAP-B194 is changeable at the user side as will be described later. Accordingly, among the wirings of the respective macros, at least the wiring between the multiplexer 192 (buffers BUF31 and BUF32) and the TAP-B194 is formed in the variable wiring layer. The wiring between the other macros may be formed in either the fixed wiring layer or the variable wiring layer.

As described above, in the third embodiment, the placement information of the bulk patterns and wiring information which are previously designed to realize the function of the test circuit as shown in FIG. 18 are prepared as the library, and this library is used when design of the semiconductor integrated circuit is performed. As a result, as for the function of the test circuit provided as the library, the function of the test circuit can be realized by only an easy operation of applying the information shown in the library without performing the design of the wiring between the bulk patterns in addition to the placement of the bulk patterns and their wirings. Accordingly, the two TAP controllers (TAP-A193, TAP-B194) included inside the chip looks exclusive from the outside of the chip, the effect of being capable of reducing the number of external terminals (the number of external I/Os) is obtained, and the time and cost relating to the development of the semiconductor integrated circuit is reduced to be able to reduce the burden.

Figure 19:
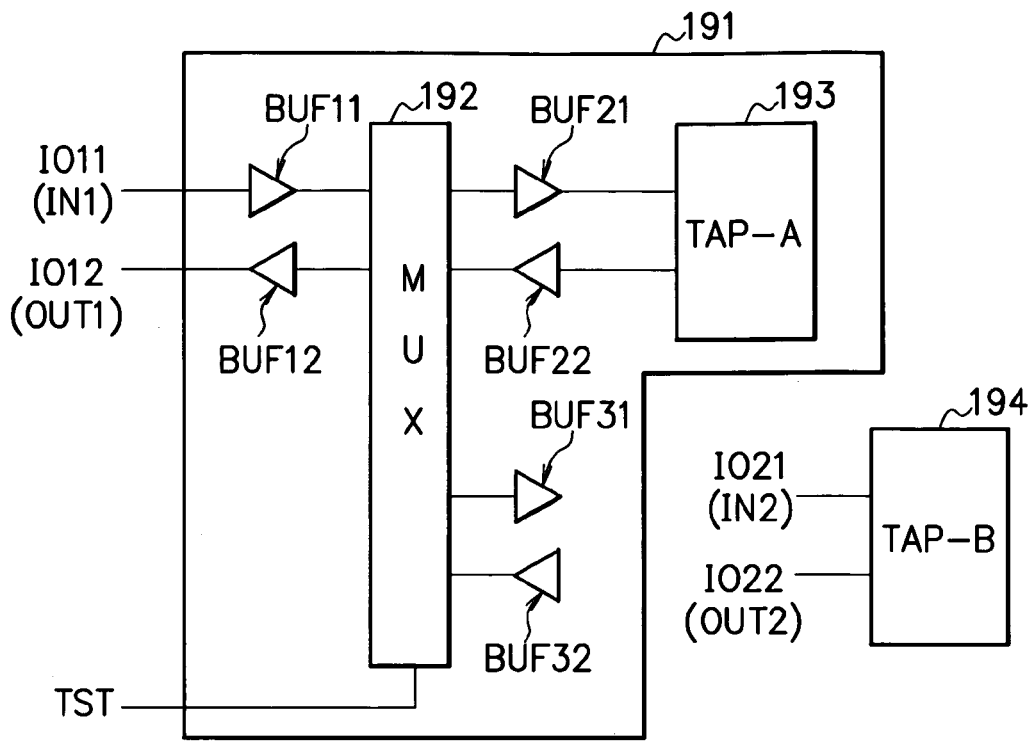
FIG. 19 is a diagram showing a circuit modified example of the semiconductor integrated circuit in the third embodiment.
Figure 20:
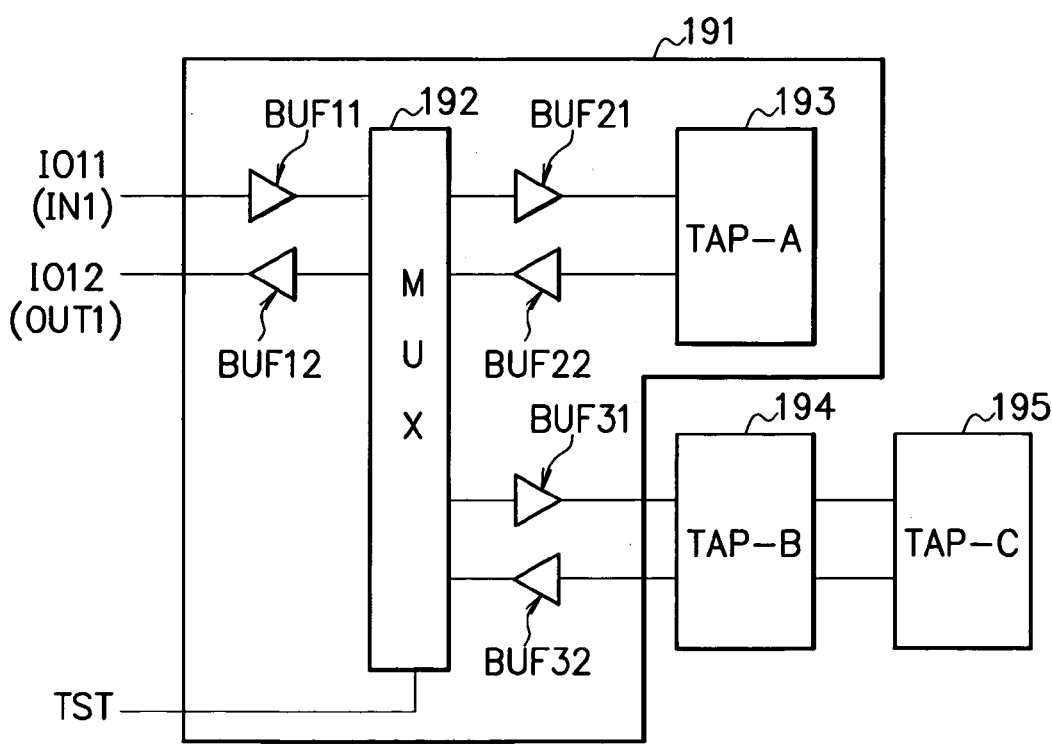
FIG. 20 is a diagram showing another circuit modified example of the semiconductor integrated circuit in the third embodiment.

Further, the wirings between the multiplexer 192 (buffers BUF32 and BUF32) and the TAP-B194 are made changeable at the user side, namely, can be customized, and thereby, a part of the circuit configuration is changed and various applications are made possible. Hereinafter, one example of customization of the semiconductor integrated circuit according to the third embodiment will be shown referring to FIGS. 19 to 21. In FIGS. 19 to 21, only the circuit part corresponding to FIG. 18 is shown.

FIG. 19 is a diagram showing a circuit modification example of the semiconductor integrated circuit in the third embodiment. The example shown in FIG. 19 is that the wirings between the multiplexer 192 (buffers BUF31 and BUF32) and the TAP-B194 are deleted, and the input terminal and the output terminal of the TAP-B194 are respectively connected to external terminals (pins) IO21 (input IN2) and IO22 (output OUT2) different from the external terminals IO11 and IO12.

By connecting the input terminal and the output terminal of the TAP-B194 to the external terminals IO21 and IO22 in this manner, the TAP-A193 and the TAP-B194 inside the chip look independent from the outside of the chip, and it becomes possible to operate the two TAP controllers 193 and 194 by independently controlling them.

Optional logic circuits (AND circuit, OR circuit and NAND circuit) and the like may be inserted between the input terminal and output terminal of the TAP-B194 and the external terminals IO21 and IO22. The buffers BUF31 and BUF32 relating to the deleted wirings may be deleted or may be left as they are, and if they are left, the output terminal of the buffer BUF31 may be floating, but it is preferable to clip the input terminal of the buffer BUF32 to VDD (power source potential) or VSS (reference potential).

FIG. 20 is a diagram showing another circuit modification example of the semiconductor integrated circuit in the third embodiment. The example shown in FIG. 20 is the one in which a third TAP controller (TAP-C) 195 is further connected to the TAP-B194 in a daisy chain (series) in the circuit configuration shown in FIG. 18. When the TAP controller is connectable in series like this, a plurality of TAP controllers are connected in daisy-chain as shown in FIG. 20, and the number of circuit elements (for example, processors) corresponding to the TAP controllers can be optionally increased. Different circuit elements and the like can be included.

FIG. 21 is a diagram showing another circuit modified example of the semiconductor integrated circuit in the third embodiment. The example shown in FIG. 21 is the one in which a fourth TAP controller (TAP-D) 196 of which layout design is newly performed at the user side is connected to the multiplexer 192 without using the TAP-B194 prepared in the library. The TAP-B194 which is not used may be deleted or may be left as it is.

As described above, it is possible to connect the TAP-D196 newly laid out to the multiplexer 192 without using the existing TAP-B194 in the library, namely, it is possible to connect a different TAP controller to the multiplexer 192 by effectively utilizing the existing multiplexer 192. For example, if the TAP-B194 is a TAP controller corresponding to a certain kind (type A) of CPU, and the TAP-D196 is a TAP controller corresponding to a different kind (type B) of CPU, the different CPUs can be connected by also applying the existing multiplexer 192.

The customization for the semiconductor integrated circuit according to the third embodiment is not limited to them, but it is possible to perform customization optionally in a changeable range. For example, it is possible to perform customization by combining what is shown in FIGS. 19 to 21 optionally.

In the aforementioned explanation, designed information for realizing the circuit configuration shown in FIG. 18 is registered as the library, but the designed information for realizing the circuit portion 191 with the changeable portion excluded may be registered as the library. In this case, the interface portions with the outside, namely, the output terminal of the buffer BUF31 and the input terminal of the buffer BUF32 are fixed to be connectable to the TAP-B194 and the TAP-D196.

FIG. 22 is a diagram showing a concrete example of circuit package of the semiconductor integrated circuit in the third embodiment. In FIG. 22, reference numeral 221 denotes a chip in which a multiplexer 222, a TAP controller 223 for the test of the entire chip, and a processor core 224 are formed. A TAP controller 225 for a processor is formed in the processor core 224. Here, the multiplexer 222, the TAP controller 223 for the test of the entire chip and the TAP controller 225 for the processor correspond to the multiplexer 192, the TAP-A193 and the TAP-B194 shown in FIG. 18 respectively.

The macro 221 corresponds to the IEEE1149.1 standard, and has external terminals (pins) which are respectively used as the test data input TDI, the test clock TCK, the test mode selection TMS, the test reset nTRST and the test data output TDO in compliance with the IEEE1149.1 standard. Further, the macro 221 has an external terminal for inputting a test mode signal TST for controlling the multiplexer 222 to switch to any one of TAP controllers 223 and 225.

The multiplexer 222 is constructed by using the OR circuit, the AND circuit and the 2-1 selector circuit in accordance with whether it is an input signal from the outside of the chip (test data input TDI, the test clock TCK, the test mode selection TMS, the test reset nTRST), or an output signal to the outside of the chip (test data output TDO), or whether the signal is positive logic, negative logic or the like. The multiplexer 222 transmits each signal to and from any one of the TAP controllers 223 and 225 corresponding to the test mode signal TST.

The aforementioned method of preparing the designed information for realizing the test circuit function in the third embodiment as the library, and performing layout design by using it is applicable to not only the semiconductor integrated circuit shown in the first and second embodiments, but also optional ASIC including a gate array and the like which is provided by fixing the bulk layer and a part or entire wiring.

Initial Layout Design in Semiconductor Integrated Circuit in Each Embodiment

Here, an initial layout design method of the semiconductor integrated circuit in each of the aforementioned embodiments, namely, a layout design method according to initial placement of the bulk patterns of which examples are shown in FIGS. 1, 10, 11 and the like will be explained.

Figure 23:
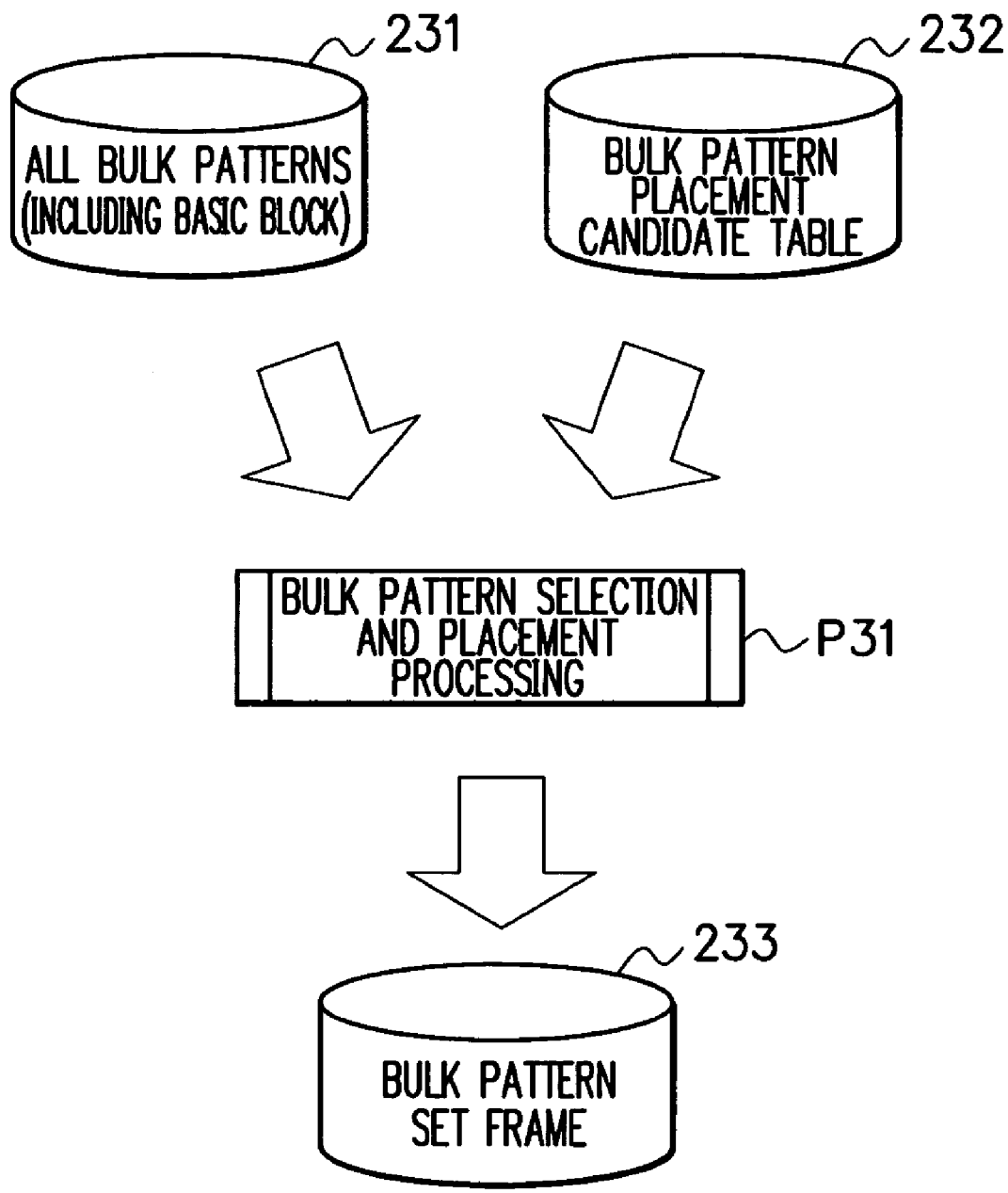
FIG. 23 is a diagram schematically showing a layout design method according to initial placement of the bulk patterns in the semiconductor integrated circuit in each of the embodiments.

FIG. 23 is a diagram schematically showing a layout design method (initial placement method of the bulk patterns) of the semiconductor integrated circuit in each of the embodiments.

In the initial layout design in the semiconductor integrated circuit (design of the initial placement of the bulk patterns), bulk pattern selection and placement processing P31 is performed by referring to bulk pattern data 231 which is the set information of the bulk patterns in the frame and a bulk pattern placement candidate table 232 showing the bulk patterns which can be placed in the frame. The basic blocks shown in the second embodiment and the like may be included in the bulk pattern data 231 and the bulk pattern placement candidate table 232.

In the bulk pattern selection placement processing P31, a bulk pattern is selected from the bulk pattern placement candidate table 232 in accordance with the set value shown in the bulk pattern data 231 for each predetermined region in the frame, and the bulk pattern is set as the bulk pattern for the predetermined region and is placed. By this processing P31, the bulk pattern set frame data 233 in which the bulk patterns are placed in the entire frame as shown in FIGS. 1, 10 and 11 (to be laid on the region in which the bulks can be disposed in the bulk layer) can be obtained.

Next, the initial layout design method of the semiconductor integrated circuit in each of the embodiments will be explained in detail FIG. 24 is a flowchart showing the initial layout design method of the semiconductor integrated circuit in each of the embodiments.

First, in step S31, the bulk pattern data 231 (the set values of the bulk patterns) showing the bulk patterns to be placed in each region in the frame is inputted in step S31.

Next, in step S32, a bulk pattern corresponding to the set value of the bulk pattern inputted in step S31 is selected for each of the predetermined region in the frame and set and placed in the region. The selection of the bulk pattern is performed by referring to the bulk pattern placement candidate table showing the bulk patterns applicable to the semiconductor integrated circuit, namely, placeable in the frame.

Subsequently, in step S33, it is determined whether the region in which the bulk pattern is not placed is present in the frame or not. When the region in which the bulk pattern is not placed is present as a result of the determination, the flow returns to step S32 and the aforementioned processing is performed again.

On the other hand, when the region in which the bulk pattern is not placed is absent, namely, the placement of the bulk patterns is completed for all the regions in the frame where the bulks are placeable as the result of the determination in step S33, the bulk pattern set frame data is generated and outputted in step S34, and the processing is finished.

Other Embodiments

The processing relating to the layout design method of the aforementioned semiconductor integrated circuit can be realized by executing the program stored in the ROM by the computer having a CPU or a MPU, RAM, ROM or the like, and the above-described program is included in the embodiment of the present invention. The processing can be realized by recording the program which has the computer operate to perform the above described function in a recording medium such as, for example, CD-ROM, and having the computer read the program, and the recording medium storing the above described program is included in the embodiments of the present invention. As the recording media for recording the above described program, a flexible disk, a hard disk, a magnetic tape, an optical magnetic disk, a non-volatile memory card and the like can be used other than the CD-ROM.

The program product by which the function of the above described embodiment is realized by a computer executing the program and performing the processing is included in the embodiment of the present invention. The above described program product includes the program itself which realizes the function of the above described embodiments, a computer in which the above described program is read, a communication device capable of providing the above described program to a computer communicably connected via a network, a network system including the communication device and the like.

The functions of the above described embodiments are not only realized by executing the supplied program by the computer, but also realized by cooperation of the OS (operating system) operating in the computer or other application software and the like, and by performing all or part of the processing of the supplied program by an expansion board or an expansion unit of the computer. In order to utilize the present invention in the network environments, all or a part of the program may be executed by another computer.

Figure 9:
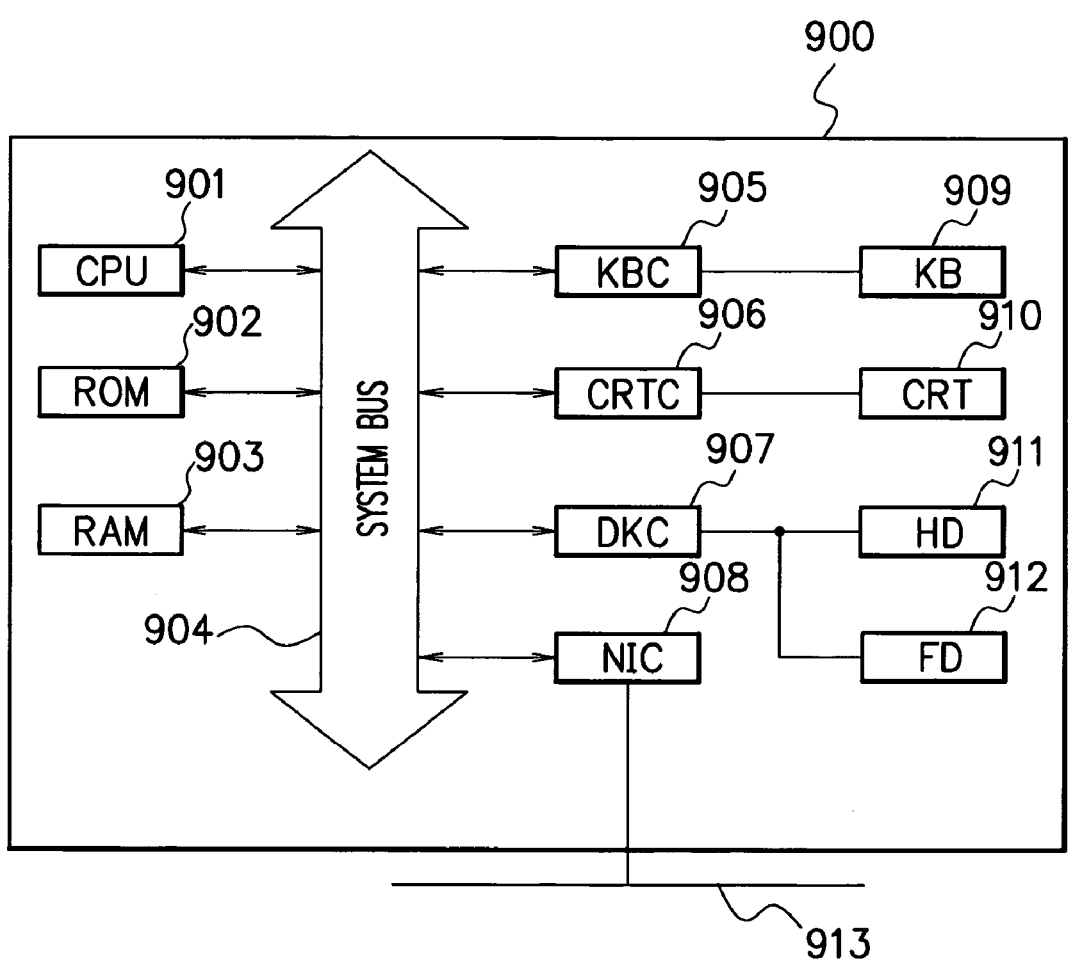
FIG. 9 is a diagram showing a computer function capable of executing the layout design method of the semiconductor integrated circuit in each of the embodiments of the present invention.

For example, the layout design method of the semiconductor integrated circuit according to the aforementioned embodiment uses a computer function 900 shown in FIG. 9 and is executable by its CPU 901.

The computer function 900 has the configuration in which the CPU 901, a ROM 902, a RAM 903, a key board controller (KBC) 905 of a key board (KB) 909, a CRT controller (CRTC) 906 of a CRT display (CRT) 910 as a display part, a disk controller (DKC) 907 of a hard disk (HD) 911 and a flexible disk (FD) 912, and a network interface card (NIC) 908 are communicably connected via a system bus 904 as shown in FIG. 9.

The CPU 901 generally controls each of the components connected to the system bus 904 by executing the software (program) stored in the ROM 902 or the HD911 or software (program) supplied from the FD 912.

Namely, the CPU 901 performs control for realizing the operation in the above described embodiments by reading the processing program for performing the aforementioned operation from the ROM 902, the HD 911 or the FD 912.

The RAM 903 functions as a main memory, a work area or the like of the CPU 901.

The KBC 905 controls the instruction input from the KB909 and a pointing device or the like not shown. The CRTC 906 controls the display of the CRT 910. The DKC 907 controls access to the HD 911 and the FD 912 which store a boot program, various applications, a user file, a network management program and the above described processing programs or the like in the above described embodiments. The NIC 908 exchanges data in the bilateral direction with the other devices on the network 913.

In the aforementioned embodiments of the present invention, the semiconductor integrated circuit of the six-layer wiring with the first, fifth and the sixth wiring layers PL1, PL5 and PL6 made fixed wiring layers, and the second, third and forth wiring layers PL2, PL3 and PL4 made variable wiring layers is shown as one example, but the present invention is applicable to the semiconductor integrated circuit with a multi-layered wirings (the number of wiring layers is optional) without being limited to this, and if only at least one variable wiring layer is included, the variable wiring layer and the fixed wiring layer are optional. As described above, the fixed wiring and the variable wiring may be realized by only the wirings formed in the wiring layers, or by the via provided between the wiring layers, or by the combination of the wirings formed in the wiring layer and the vias provided between the wiring layers.

The above described embodiments are only examples of the embodiment in carrying out the present invention, and the technical scope of the present invention must not be interpreted limitedly. The present invention can be carried out in various forms without deviating from the technical concept, or the main characteristics.

According to the present invention, on developing a semiconductor integrated circuit corresponding to a use purpose, the desired semiconductor integrated circuit can be manufactured by only designing the wirings of variable wiring layers for each individual kind of product and producing masks for forming the designed wirings. Accordingly, since only the minimum number of masks have to be produced for each individual kind of product, the development cost can be reduced sharply, and since only the wirings of the limited wiring layers are designed and the number of masks to be produced for each individual kind of product is reduced, the development time period can be sharply reduced. With this, the number of man hours, namely, labor cost can be sharply reduced, and complication in development can be avoided.

What is claimed is:

1. A semiconductor integrated circuit which is a master-slice-type semiconductor integrated circuit, comprising:
    a bulk layer on which a plurality of bulk patterns to realize specific circuit functions are formed; and
    a plurality of wiring layers sequentially formed in layers on said bulk layer and including variable wiring layers of which wiring patterns is changeable by a user and fixed wiring layers of which wiring patterns is unchangeable by the user,
    wherein said bulk layer is filled with the plurality of bulk patterns which are fixed and selected;
    wherein said bulk patterns and their placement in said bulk layer is unchangeable by the user;
    wherein each of said bulk patterns controls the circuit function by the wiring pattern formed on each of said variable wiring layers; and
    wherein said variable wiring layers include a wiring pattern of the wiring for supplying power to the circuit and a wiring pattern of the wiring which connects to or does not connect to the power source to supply logic to the terminal which switches the mode inside the circuit, in accordance with the circuit formed in said bulk layer by said bulk patterns.

2. The semiconductor integrated circuit according to claim 1, wherein a predetermined wiring pattern is previously formed in some wiring layers of said plurality of wiring layers.

3. The semiconductor integrated circuit according to claim 2, wherein the predetermined wiring pattern includes at least one of a wiring pattern to supply a clock signal, a wiring pattern for a test circuit constituted of the bulk patterns and a wiring pattern for power supply.

4. The semiconductor integrated circuit according to claim 1, wherein a plurality of the bulk patterns are placed with a basic block constituted by optionally combining the plurality of the bulk patterns as a unit.

5. The semiconductor integrated circuit according to claim 1, wherein a basic block is constituted by combining the plurality bulk patterns which are fixed and selected, and a plurality of the basic blocks are previously placed in a predetermined region on a chip surface.

6. The semiconductor integrated circuit according to claim 5, wherein the predetermined region is a region obtained by excluding a region where bulk patterns of which use by a user is prohibited are placed from a region of the entire chip surface where the plurality of bulk patterns which are fixed and selected are formed.

7. The semiconductor integrated circuit according to claim 6, wherein the region where the bulk patterns of which use by the user is prohibited are placed is a region where bulk patterns relating to an external interface and a bulk pattern relating to a clock control are placed.

8. The semiconductor integrated circuit according to claim 5, wherein a plurality of kinds of basic blocks of which combinations of the bulk patterns constituting the basic blocks differ from each other are placed.

9. The semiconductor integrated circuit according to claim 5, wherein a layout designed library realizing specific circuit functions by using N (N is an optional natural number) of the basic blocks previously prepared is assigned to optional placed basic blocks, and thereby, the circuit functions are realized.

10. The semiconductor integrated circuit according to claim 9, wherein the layout designed library includes placement information of the bulk patterns and wiring information.

11. The semiconductor integrated circuit according to claim 1, wherein a layout designed library including the placement information of the bulk patterns and wiring information to realize a function of a test circuit is used and the library is applied, and thereby, the function of the test circuit is realized.

12. The semiconductor integrated circuit according to claim 11, wherein some of wiring patterns shown in the wiring information are changeable by a user.

13. The semiconductor integrated circuit according to claim 11, wherein the test circuit is a circuit executing a test in conformity with the IEEE1149.1 standard.

14. The semiconductor integrated circuit according to claim 13, wherein the test circuit connects to two test access port controllers, and has a multiplexer switching the test access port controllers to be used.

15. A method for designing layout of a master-slice-type semiconductor integrated circuit having a bulk layer on which a plurality of bulk patterns to realize specific circuit functions are placed, and a plurality of wiring layers, which are sequentially formed in layers on said bulk layer, and include variable wiring layers of which wiring patterns are changeable by a user and fixed wiring layers of which wiring patterns are unchangeable by the user, comprising:
    a bulk pattern initial placement step selecting bulk patterns corresponding to set information indicating bulk patterns to be placed from previously prepared bulk patterns placed on said bulk layer, and placing the bulk patterns on said bulk layer by a computer processor;
    an initial wiring setting step setting a wiring pattern set as an initial value from a plurality of wiring patterns corresponding to each of said bulk patterns by using identification information uniquely determining a wiring pattern as an initial wiring pattern, for the bulk patterns which are placed after placing said bulk patterns in said bulk pattern initial placement step by the computer processor;
    a wiring pattern designating step setting the identification information of the wiring patterns to realize a desired circuit function by the bulk patterns after setting the initial wiring patterns in said initial wiring setting step by the computer processor; and a wiring pattern changing step of setting the wiring pattern for the bulk pattern by replacing it based on the identification information of the wiring pattern set in said wiring pattern designating step by the computer processor, wherein said bulk layer is filled with the plurality of bulk patterns which are fixed and selected;

wherein said bulk patterns and their placement in said bulk layer is unchangeable by the user;

wherein each of said bulk patterns controls the circuit function by the wiring pattern formed on each of said variable wiring layers; and wherein said variable wiring layers include a wiring pattern of the wiring for supplying power to the circuit and a wiring pattern of the wiring which connects to or does not connect to the power source to supply logic to the terminal which switches the mode inside the circuit, in accordance with the circuit formed in said bulk layer by said bulk patterns.

16. The method for designing layout of a semiconductor integrated circuit according to claim 15, wherein the identification information is a code which is assigned to each of the wiring patterns, and differs for each of the wiring patterns.

17. The method for designing layout of a semiconductor integrated circuit according to claim 15, wherein in said wiring pattern designating step, only the identification information of the wiring pattern relating to the bulk pattern of which wiring pattern is to be replaced is set.

18. The method for designing layout of a semiconductor integrated circuit according to claim 15, wherein in said wiring pattern designating step, the identification information of the wiring patterns relating to all the bulk patterns is set.

19. The method for designing layout of a semiconductor integrated circuit according to claim 15, wherein by said wiring pattern changing step, a wiring pattern relating to the bulk pattern, which is to be unused by being replaced with the wiring pattern is deleted.

20. The method for designing layout of a semiconductor integrated circuit according to claim 15, in said wiring pattern changing step, the wiring pattern is replaced to operate the bulk pattern by a different logic function.

21. The method for designing layout of a semiconductor integrated circuit according to claim 15, wherein said bulk pattern initial placement step includes a first design step assigning a layout designed library realizing specific circuit functions by using N (N is an optional natural number) of the previously prepared basic blocks constituted by combining the plurality of bulk patterns to the basic blocks realizing the circuit functions.

22. The method for designing layout of a semiconductor integrated circuit according to claim 21, wherein the predetermined region is a region obtained by excluding a region where bulk patterns of which use by a user is prohibited are placed from a region of the entire chip surface where the plurality of bulk patterns which are fixed and selected are formed.

23. The method for designing layout of a semiconductor integrated circuit according to claim 22, wherein the region where the bulk patterns of which use by the user is prohibited are placed is a region where bulk patterns relating to an external interface and a bulk pattern relating to a clock control are placed.

24. The method for designing layout of a semiconductor integrated circuit according to claim 21, further comprising:

a library setting step of setting the layout designed library which is assigned to the basic block, wherein in said first design step, the layout designed library is assigned to the designated basic block in accordance with setting in said library setting step.

25. The method for designing layout of a semiconductor integrated circuit according to claim 24, wherein said first design step comprises a selection step selecting the layout designed library in accordance with the setting of said library setting step, and an assignment step assigning the layout designed library selected in said selection step to the designated basic block.

26. The method for designing layout of a semiconductor integrated circuit according to claim 25, wherein said layout designed library has placement information of the bulk patterns and wiring information; and wherein in said assignment step, the placement information of the bulk patterns and the wiring information, or only the placement information of the bulk patterns are or is reflected in the designated basic block.

27. The method for designing layout of a semiconductor integrated circuit according to claim 21, further comprising:

a second design step performing user layout to realize an optional circuit function by using unused bulk patterns after assigning the layout designed library to the basic block in said first design step.

28. The method for designing layout of a semiconductor integrated circuit according to claim 27, wherein in said second design step, a wiring pattern to realize the optional circuit function is set for the unused bulk patterns.

29. The method for designing layout of a semiconductor integrated circuit according to claim 15, wherein said bulk pattern initial placement step is completed by assigning a layout designed library realizing specific circuit functions by using N (N is an optional natural number) of the previously prepared basic blocks constituted by combining the plurality of bulk patterns to optional basic blocks of the semiconductor integrated circuit.

30. The method for designing layout of a semiconductor integrated circuit according to claim 15, further comprising:

a test circuit design step applying a layout designed library including placement information of the bulk patterns and wiring information to realize a function of the test circuit to the bulk layer and wring layers.

31. The method for designing layout of a semiconductor integrated circuit according to claim 30, wherein some of wiring patterns shown in the wiring information are changeable by a user.

32. A program product stored in a computer storage device for having a computer execute a method for designing layout of a master-slice-type semiconductor integrated circuit having a bulk layer on which a plurality of bulk patterns to realize specific circuit functions are placed, and a plurality of wiring layers, which are sequentially formed in layers on said bulk layer, and include variable wiring layers of which wiring patterns are changeable by a user and fixed wiring layers of which wiring patterns are unchangeable by the user, comprising:

a bulk pattern initial placement step selecting bulk patterns in accordance with set information showing bulk patterns to be placed from previously prepared bulk patterns placed on the bulk layer and placing the bulk patterns on the bulk layer;

an initial wiring setting step setting a wiring pattern set as an initial value from a plurality of wiring patterns corresponding to each of said bulk patterns by using identification information uniquely determining a wiring pattern as an initial wiring pattern, for each of the bulk patterns which are placed after placing said bulk patterns in said bulk pattern initial placement step;

a wiring pattern designating step setting the identification information of the wiring patterns to realize a desired circuit function by the bulk patterns after setting the initial wiring pattern in said initial wiring setting step; and a wiring pattern changing step setting the wiring pattern for the bulk pattern by replacing it based on the identification information of the wiring pattern set in said wiring pattern designating step, wherein said bulk layer is filled with the plurality of bulk patterns which are fixed and selected;

wherein said bulk patterns and their placement in said bulk layer is unchangeable by the user;

wherein each of said bulk patterns controls the circuit function by the wiring pattern formed on each of said variable wiring layers; and wherein said variable wiring layers include a wiring pattern of the wiring for supplying power to the circuit and a wiring pattern of the wiring which connects to or does not connect to the power source to supply logic to the terminal which switches the mode inside the circuit, in accordance with the circuit formed in said bulk layer by said bulk patterns.

33. The program product according to claim 32, wherein said bulk pattern initial placement step includes a first design step assigning a layout designed library realizing specific circuit functions by using N (N is an optional natural number) of the previously prepared basic blocks constituted by combining the plurality of bulk patterns to basic blocks realizing the circuit functions.

34. The program product according to claim 33, further comprising:

a second design step of further performing user layout to realize an optional circuit function by using unused bulk patterns after assigning the layout designed library to the basic blocks in said first design step.

35. The program product according to claim 32 further comprising:

a test circuit design step applying a layout designed library including placement information of the bulk patterns and wiring information to realize a function of the test circuit to the bulk layer and wring layers.

* * * * *

UNITED STATES PATENT AND TRADEMARK OFFICE
CERTIFICATE OF CORRECTION

| | | |
|---|---|---|
| PATENT NO. | : 7,562,329 B2 | Page 1 of 1 |
| APPLICATION NO. | : 11/108676 | |
| DATED | : July 14, 2009 | |
| INVENTOR(S) | : Hiroyuki Matsubara | |

It is certified that error appears in the above-identified patent and that said Letters Patent is hereby corrected as shown below:

Column 24, Line 44, change "wring" to --wiring--.

Column 26, Line 17, change "claim 32" to --claim 32,--.

Column 26, Line 22, change "wring" to --wiring--.

Signed and Sealed this

Third Day of November, 2009

David J. Kappos
*Director of the United States Patent and Trademark Office*